(12) United States Patent
    Kliuchnikov et al.

(10) Patent No.: US 12,657,503 B2
(45) Date of Patent: Jun. 16, 2026

(54) EXECUTION OF QUBIT GATES

(71) Applicant: Microsoft Technology Licensing, LLC, Redmond, WA (US)

(72) Inventors: Vadym Kliuchnikov, Redmond, WA (US); Alexander Vaschillo, Redmond, WA (US); Martin Henri Roetteler, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 2 days.

(21) Appl. No.: 17/164,630

(22) Filed: Feb. 1, 2021

(65) Prior Publication Data
    US 2021/0374591 A1     Dec. 2, 2021

Related U.S. Application Data

(63) Continuation-in-part of application No. 16/888,351, filed on May 29, 2020, now abandoned.

(51) Int. Cl.
    G06N 10/00     (2022.01)
    G06N 10/60     (2022.01)
    H03K 19/195     (2006.01)

(52) U.S. Cl.
    CPC ........... G06N 10/60 (2022.01); H03K 19/195 (2013.01)

(58) Field of Classification Search
    None
    See application file for complete search history.

(56) References Cited

U.S. PATENT DOCUMENTS

2004/0078421 A1     4/2004     Routt
2021/0374586 A1     12/2021     Kliuchnikov et al.

FOREIGN PATENT DOCUMENTS

WO     2019032103 A1     2/2019

OTHER PUBLICATIONS

"Quantum Computing: Progress and Prospects (2019)" by the Nation Academies of Sciences, Engineering and Medicine chapter 7 (Year: 2019).*
"First quantum computer to pack 100 qubits enters crowded race" Nature vol. 599 p. 542 (Year: 2021).*
"Will Quantum Computing Ever Live Up to Its Hype?" by John Horgan, Scientific American (Year: 2021).*
"How to Fix Quantum Bugs" by Zaira Nazario Scientific American (Year: 2022).*
Quantum Computing in the NISQ era and beyond by John Preskill Quantum Journal (Year: 2018).*
"Quantum Technology Monitor" Mckinsey&Company (Year: 2022).*
(Continued)

*Primary Examiner* — Bradley Smith
(74) *Attorney, Agent, or Firm* — Alleman Hall LLP

(57) ABSTRACT

One aspect of this disclosure relates to a method for operating a quantum computing device. A request to execute a first n-qubit gate on a set of n target qubits is received. The first n-qubit gate is representable as an m-qubit diagonal gate conjugated by a Clifford gate, where m≤n. A set of m interface qubits on which to perform the m-qubit diagonal gate are identified. A Clifford operation is executed on each interface qubit and its corresponding target qubits. The m-qubit diagonal gate is executed on the set of m interface qubits.

20 Claims, 19 Drawing Sheets

(56)                    References Cited

OTHER PUBLICATIONS

"Building a large-scale quantum computer with continuous-variable optical technologies" Fukui et al. J. Physics B At. Mol. Opt. Phys. 55 (Year: 2022).*

NISQ computing: where we are and where do we go? Lau et al., AAPS Bulletin (Year: 2022).*

Cuomo, et al., "Towards a Distributed Quantum Computing Eco-system (Invited Paper)", In Repository of arXiv:2002.11808v2, Mar. 28, 2020, 8 Pages.

Litinski, Daniel, "A Game of Surface Codes: Large-Scale Quantum Computing with Lattice Surgery", In Repository of arXiv:1808.02892v1, Aug. 8, 2018, 35 Pages.

"International Search Report & Written Opinion issued in PCT Application No. PCT/US2021/020485", Mailed Date: Nov. 26, 2021, 12 Pages.

Sarvaghad-Moghaddam, et al., "A General Protocol for Distributed Quantum Gates", In Repository of arXiv:1812.07798v2, Dec. 21, 2018, 8 Pages.

Litinski, Daniel, "Magic State Distillation: Not as Costly as You Think", In Repository of arXiv:1905.06903, Nov. 6, 2019, 22 Pages.

"International Search Report and Written Opinion Issued in PCT Application No. PCT/US22/013860", Mailed Date: May 27, 2022, 15 Pages.

"Non Final Office Action Issued in U.S. Appl. No. 16/888,351", Mailed Date: Jun. 15, 2022, 12 Pages.

Cross, et al., "Open Quantum Assembly Language", In Repository of arXiv:1707.03429v2, Jul. 13, 2017, 24 Pages.

Devitt, Simon J. , "Classical Control of Large-Scale Quantum Computers", In Repository of arXiv:1405.4943v1, May 20, 2014, 14 Pages.

Dijk, et al., "Impact of Classical Control Electronics on Qubit Fidelity", In Journal of Physical Review Applied, vol. 12, Issue 4, Oct. 24, 2019, 20 Pages.

Ryan, et al., "Hardware for Dynamic Quantum Computing", In Repository of arXiv:1704.08314v1, Apr. 26, 2017, 13 Pages.

Litinski, et al., "A Game of Surface Codes: Large-Scale Quantum Computing with Lattice Surgery", In Repository of arXiv:1808.02892v3, Feb. 3, 2019, 37 Pages.

"Final Office Action Issued in U.S. Appl. No. 16/888,351", Mailed Date: Dec. 22, 2022, 17 Pages.

"Extended Search Report Issued in European Patent Application No. 23175295.7", Mailed Date: Sep. 14, 2023, 11 Pages.

"Patent Board Decision Received in U.S. Appl. No. 16/286,337", Mailed Date : Nov. 30, 2023, 9 Pages.

"Hartree-Fock on a Superconducting Qubit Quantum Computer", In Repository of arXiv:2004.04174v4, Sep. 18, 2020, 30 Pages.

Arute, et al., "Quantum Supremacy Using a Programmable Superconducting Processor", In Journal of Nature, vol. 574, Issue 7779, Oct. 23, 2019, pp. 505-510.

Barenco, et al., "Elementary Gates for Quantum Computation", In Journal of Physical Review A, vol. 52, No. 5, Nov. 1, 1995, pp. 3457-3467.

Nielsen, et al., "Programmable Quantum Gate Arrays", In Journal of Physical Review Letters, vol. 79, Issue 2, Jul. 14, 1997, pp. 321-324.

Beverland, et al., "Surface Code Compilation via Edge-Disjoint Paths", In Journal of PRX Quantum, vol. 3, Issue 2, May 25, 2022, 25 Pages.

"Non-Final Office Action Issued in U.S. Appl. No. 16/888,351", Mailed Date: Jun. 8, 2023, 11 Pages.

First office Action Received for Chinese Application No. 202180038370.2, mailed on Aug. 4, 2025, 25 pages. (English Translation Provided).

Litinski et al., "A Game of Surface Codes: Large-Scale Quantum Computing with Lattice Surgery", arXiv:1808.02892v3, Feb. 3, 2019, 37 Pages.

Office Action Received for Japanese Application No. 2022561408, mailed on Jan. 24, 2025, 6 pages. (English Translation Provided).

Communication pursuant to Article 94(3) EPC Received in European Patent Application No. 21783062.9, mailed on Mar. 3, 2026, 07 pages.

Communication pursuant to Article 94(3) EPC Received in European Patent Application No. 23175295.7, mailed on Mar. 3, 2026, 08 pages.

* cited by examiner

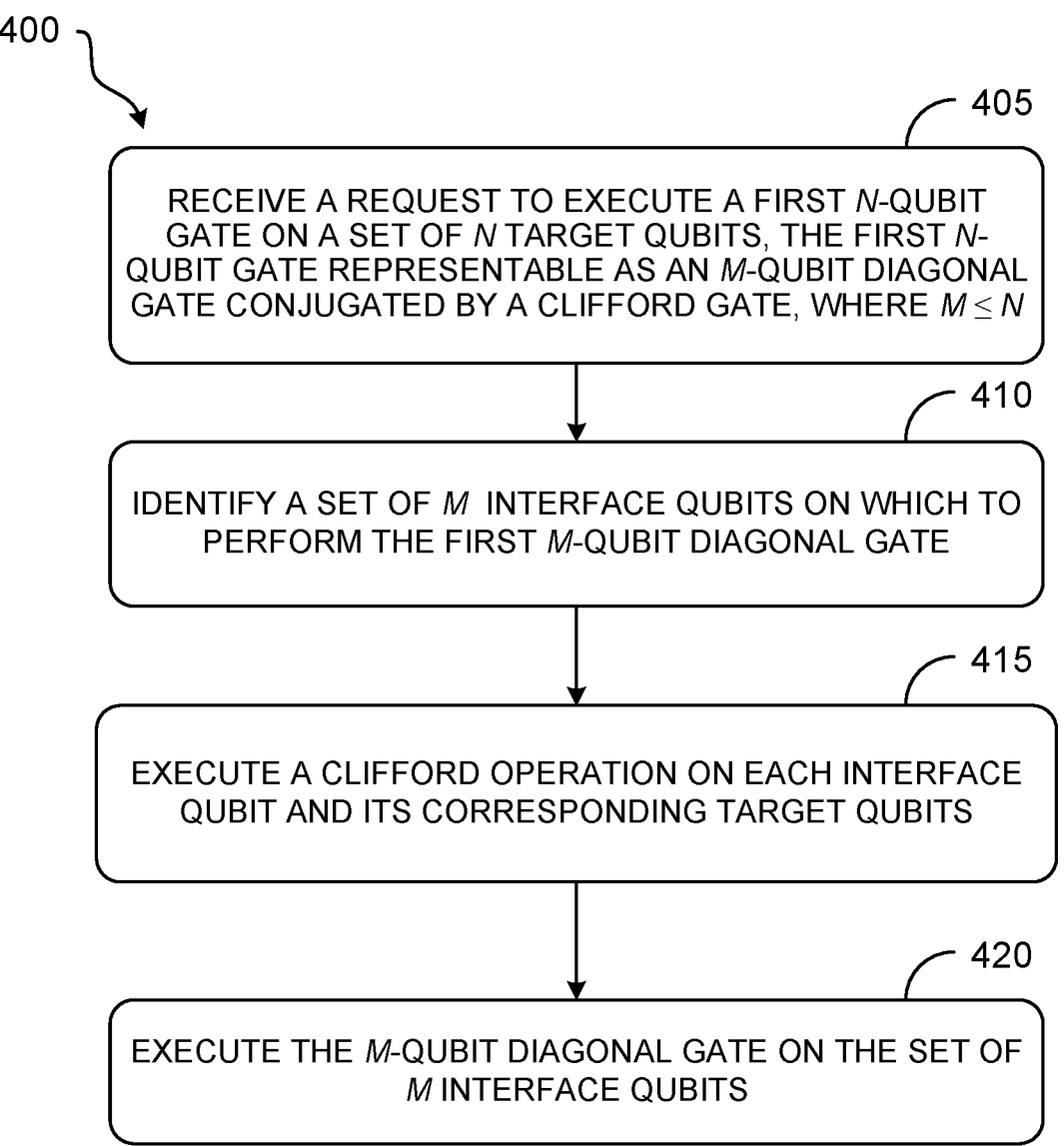

400

405

RECEIVE A REQUEST TO EXECUTE A FIRST $N$-QUBIT GATE ON A SET OF $N$ TARGET QUBITS, THE FIRST $N$-QUBIT GATE REPRESENTABLE AS AN $M$-QUBIT DIAGONAL GATE CONJUGATED BY A CLIFFORD GATE, WHERE $M \leq N$

410

IDENTIFY A SET OF $M$ INTERFACE QUBITS ON WHICH TO PERFORM THE FIRST $M$-QUBIT DIAGONAL GATE

415

EXECUTE A CLIFFORD OPERATION ON EACH INTERFACE QUBIT AND ITS CORRESPONDING TARGET QUBITS

420

EXECUTE THE $M$-QUBIT DIAGONAL GATE ON THE SET OF $M$ INTERFACE QUBITS

FIG. 4A

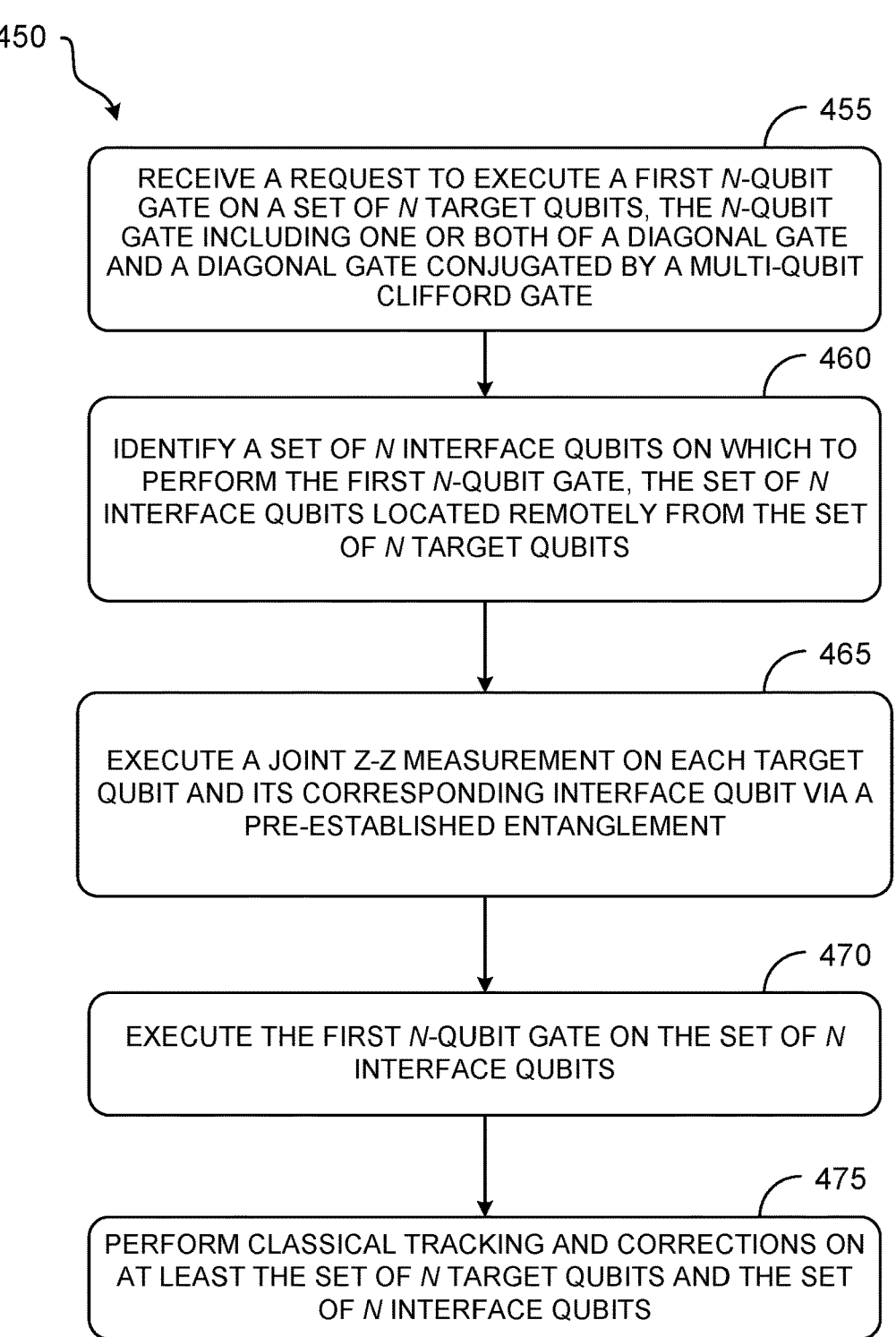

450

455

RECEIVE A REQUEST TO EXECUTE A FIRST $N$-QUBIT GATE ON A SET OF $N$ TARGET QUBITS, THE $N$-QUBIT GATE INCLUDING ONE OR BOTH OF A DIAGONAL GATE AND A DIAGONAL GATE CONJUGATED BY A MULTI-QUBIT CLIFFORD GATE

460

IDENTIFY A SET OF $N$ INTERFACE QUBITS ON WHICH TO PERFORM THE FIRST $N$-QUBIT GATE, THE SET OF $N$ INTERFACE QUBITS LOCATED REMOTELY FROM THE SET OF $N$ TARGET QUBITS

465

EXECUTE A JOINT Z-Z MEASUREMENT ON EACH TARGET QUBIT AND ITS CORRESPONDING INTERFACE QUBIT VIA A PRE-ESTABLISHED ENTANGLEMENT

470

EXECUTE THE FIRST $N$-QUBIT GATE ON THE SET OF $N$ INTERFACE QUBITS

475

PERFORM CLASSICAL TRACKING AND CORRECTIONS ON AT LEAST THE SET OF $N$ TARGET QUBITS AND THE SET OF $N$ INTERFACE QUBITS

FIG. 4B

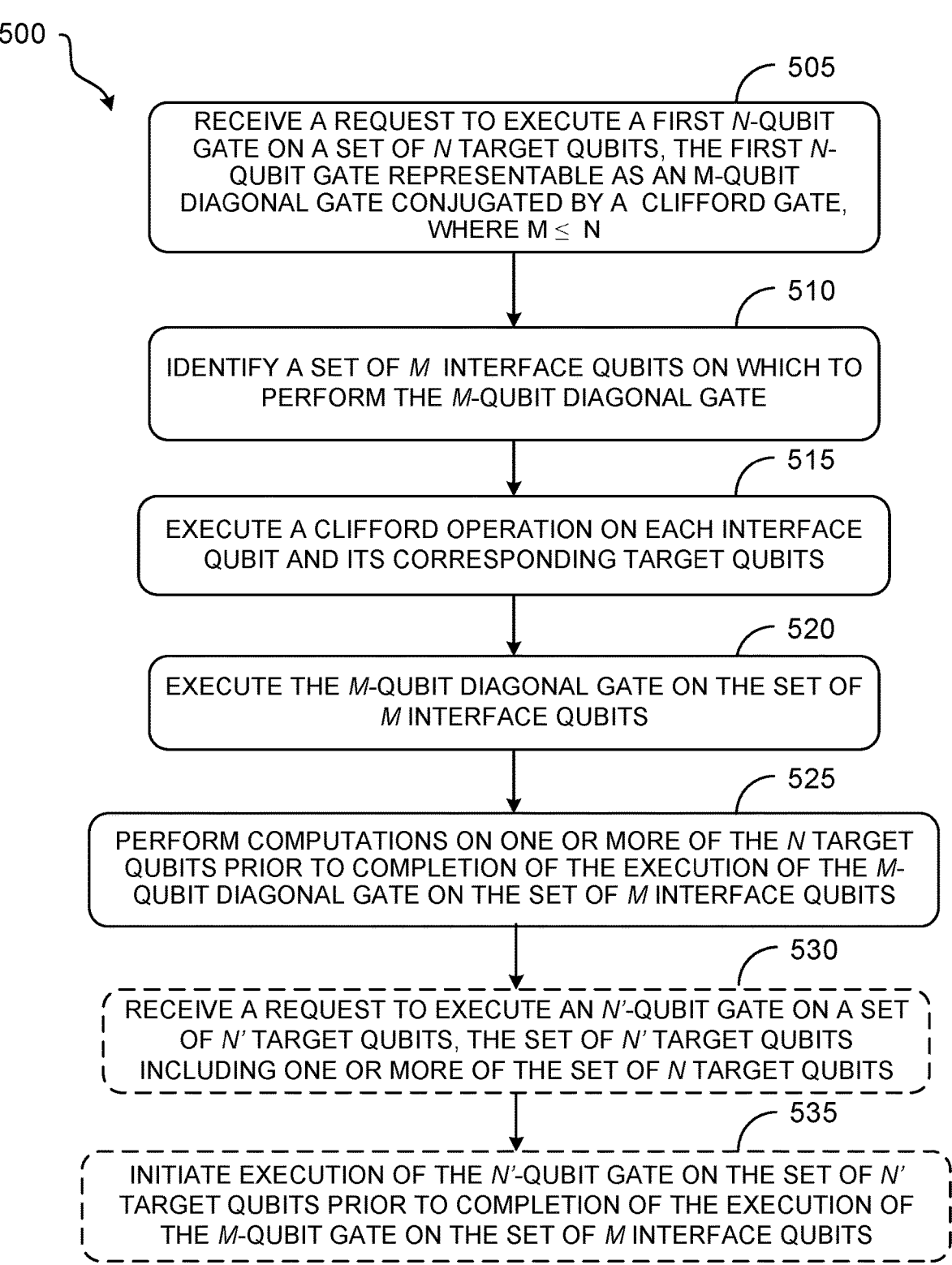

500

505

RECEIVE A REQUEST TO EXECUTE A FIRST N-QUBIT GATE ON A SET OF N TARGET QUBITS, THE FIRST N-QUBIT GATE REPRESENTABLE AS AN M-QUBIT DIAGONAL GATE CONJUGATED BY A CLIFFORD GATE, WHERE M ≤ N

510

IDENTIFY A SET OF M INTERFACE QUBITS ON WHICH TO PERFORM THE M-QUBIT DIAGONAL GATE

515

EXECUTE A CLIFFORD OPERATION ON EACH INTERFACE QUBIT AND ITS CORRESPONDING TARGET QUBITS

520

EXECUTE THE M-QUBIT DIAGONAL GATE ON THE SET OF M INTERFACE QUBITS

525

PERFORM COMPUTATIONS ON ONE OR MORE OF THE N TARGET QUBITS PRIOR TO COMPLETION OF THE EXECUTION OF THE M-QUBIT DIAGONAL GATE ON THE SET OF M INTERFACE QUBITS

530

RECEIVE A REQUEST TO EXECUTE AN N'-QUBIT GATE ON A SET OF N' TARGET QUBITS, THE SET OF N' TARGET QUBITS INCLUDING ONE OR MORE OF THE SET OF N TARGET QUBITS

535

INITIATE EXECUTION OF THE N'-QUBIT GATE ON THE SET OF N' TARGET QUBITS PRIOR TO COMPLETION OF THE EXECUTION OF THE M-QUBIT GATE ON THE SET OF M INTERFACE QUBITS

FIG. 5A

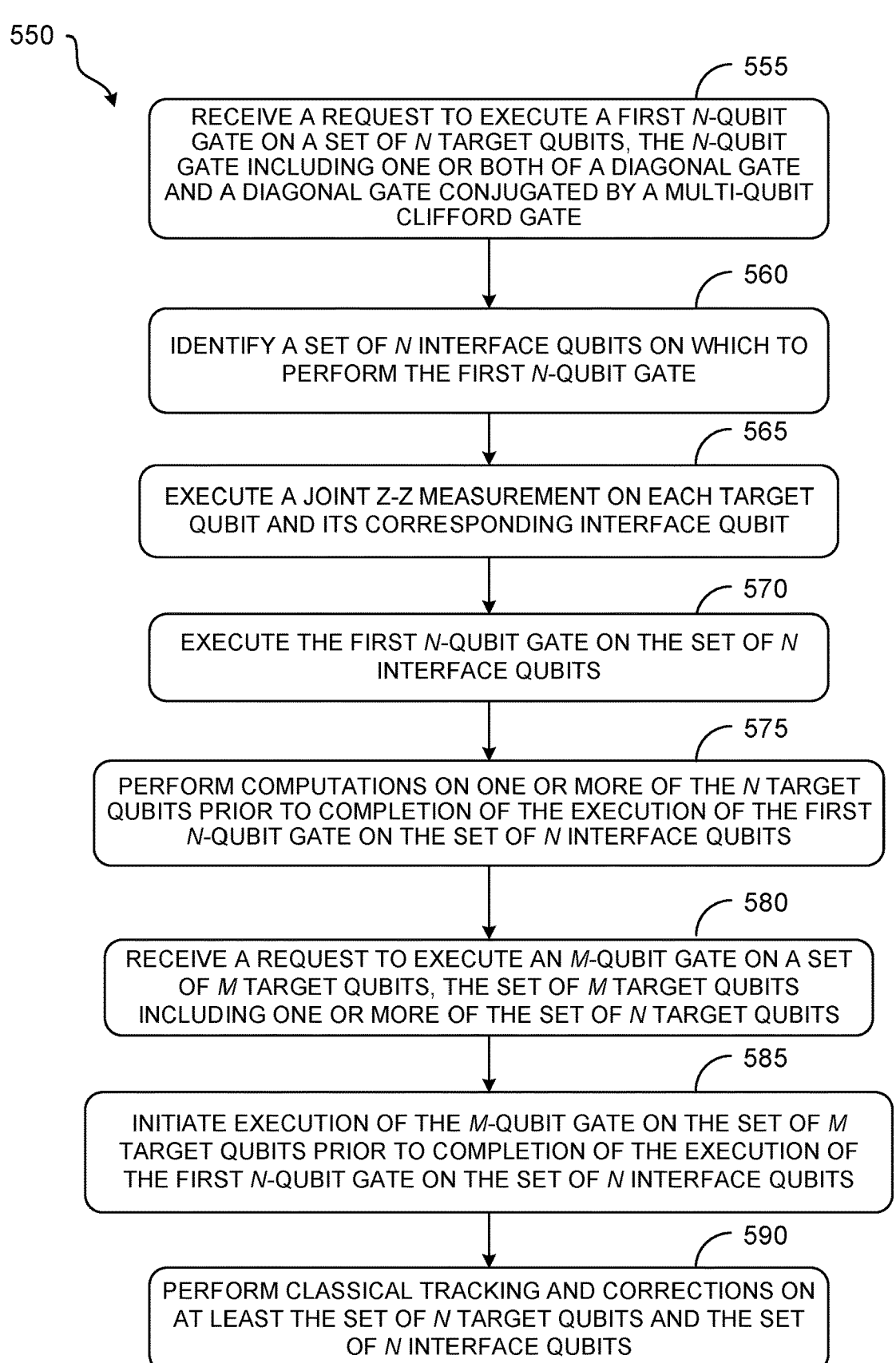

550

555
RECEIVE A REQUEST TO EXECUTE A FIRST *N*-QUBIT GATE ON A SET OF *N* TARGET QUBITS, THE *N*-QUBIT GATE INCLUDING ONE OR BOTH OF A DIAGONAL GATE AND A DIAGONAL GATE CONJUGATED BY A MULTI-QUBIT CLIFFORD GATE

560
IDENTIFY A SET OF *N* INTERFACE QUBITS ON WHICH TO PERFORM THE FIRST *N*-QUBIT GATE

565
EXECUTE A JOINT Z-Z MEASUREMENT ON EACH TARGET QUBIT AND ITS CORRESPONDING INTERFACE QUBIT

570
EXECUTE THE FIRST *N*-QUBIT GATE ON THE SET OF *N* INTERFACE QUBITS

575
PERFORM COMPUTATIONS ON ONE OR MORE OF THE *N* TARGET QUBITS PRIOR TO COMPLETION OF THE EXECUTION OF THE FIRST *N*-QUBIT GATE ON THE SET OF *N* INTERFACE QUBITS

580
RECEIVE A REQUEST TO EXECUTE AN *M*-QUBIT GATE ON A SET OF *M* TARGET QUBITS, THE SET OF *M* TARGET QUBITS INCLUDING ONE OR MORE OF THE SET OF *N* TARGET QUBITS

585
INITIATE EXECUTION OF THE *M*-QUBIT GATE ON THE SET OF *M* TARGET QUBITS PRIOR TO COMPLETION OF THE EXECUTION OF THE FIRST *N*-QUBIT GATE ON THE SET OF *N* INTERFACE QUBITS

590
PERFORM CLASSICAL TRACKING AND CORRECTIONS ON AT LEAST THE SET OF *N* TARGET QUBITS AND THE SET OF *N* INTERFACE QUBITS

FIG. 5B

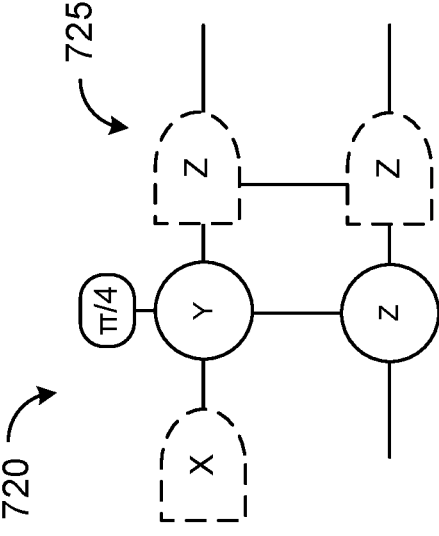
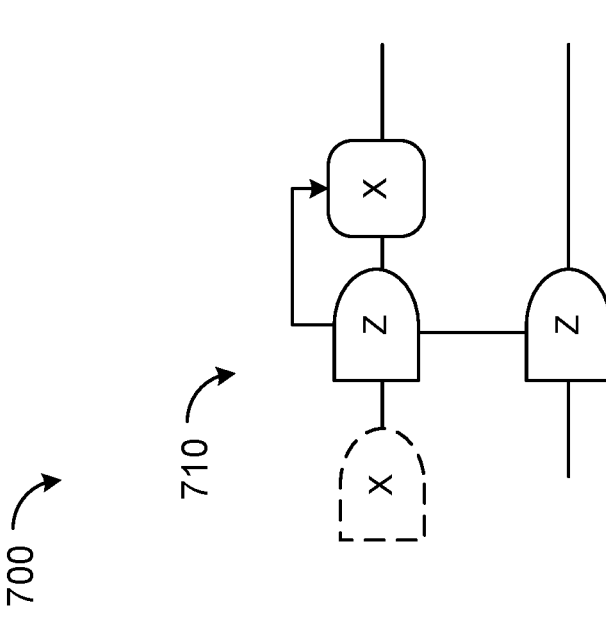
FIG. 7

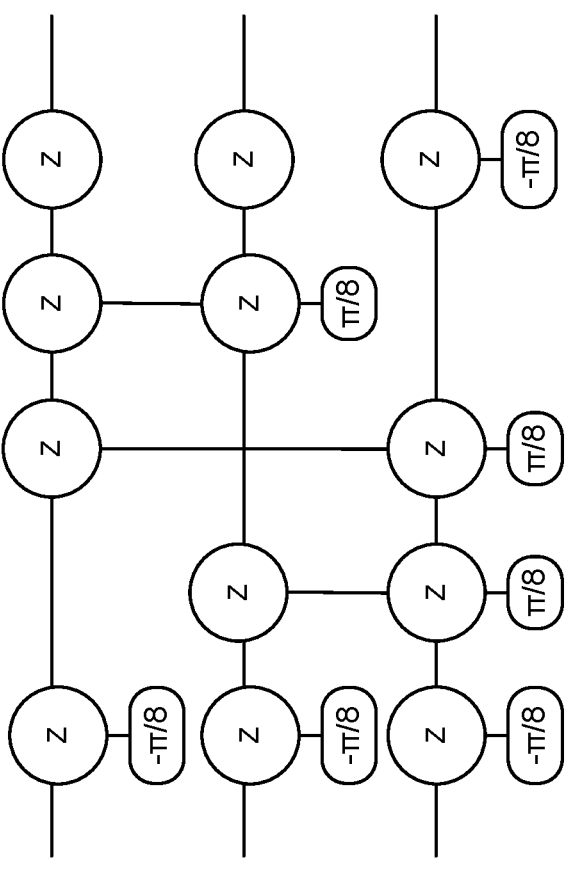
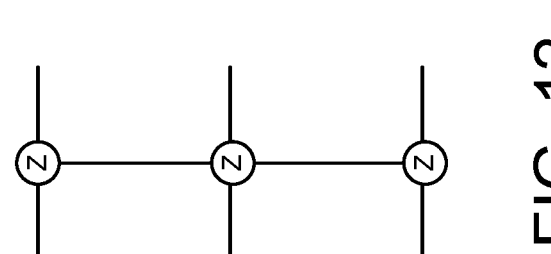
FIG. 12

EXECUTION OF QUBIT GATES

CROSS REFERENCE TO RELATED APPLICATIONS

This application is a continuation-in-part of U.S. application Ser. No. 16/888,351, filed May 29, 2020, the entirety of which is hereby incorporated herein by reference for all purposes.

BACKGROUND

A quantum computer is a physical machine configured to execute logical operations based on or influenced by quantum-mechanical phenomena. Whereas conventional computer memory holds digital data in an array of bits and enacts bit-wise logical operations, a quantum computer holds data in an array of qubits and operates quantum-mechanically on the qubits in order to implement the desired logic. One or more quantum-logic gates may thus be applied to operate on a set of qubits.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

One aspect of this disclosure relates to a method for operating a quantum computing device. A request to execute a first n-qubit gate on a set of n target qubits is received. The first n-qubit gate is representable as an m-qubit diagonal gate conjugated by a Clifford gate, where $m \leq n$. A set of m interface qubits on which to perform the m-qubit diagonal gate are identified. A Clifford operation is executed on each interface qubit and its corresponding target qubits. The m-qubit diagonal gate is executed on the set of m interface qubits.

BRIEF DESCRIPTION OF THE DRAWINGS

FIG. 4A is an example method for remote execution of a quantum gate on a quantum computing device.

FIG. 4B is an additional example method for remote execution of a quantum gate on a quantum computing device.

FIG. 5A is an example method for delayed execution of a quantum gate on a quantum computing device.

FIG. 5B is an additional example method for delayed execution of a quantum gate on a quantum computing device.

FIG. 7 schematically shows an example quantum circuit identity.

FIG. 12 schematically shows an example quantum circuit for decomposing a CCZ gate as a product of Pauli exponents.

DETAILED DESCRIPTION

Quantum computing uses quantum mechanical properties to enable computations for specific applications that would otherwise not be feasible to perform in a reasonable amount of time on conventional (i.e., nonquantum), state-of-the-art computers. Example applications include prime factorization, database searches, and physics and chemistry simulations. The fundamental unit of computation on a quantum computer is a qubit. A quantum gate or quantum logic gate is a quantum circuit configured to operate on a number of qubits. Quantum gates may serve as analogues to classical logic gates in conventional digital computers.

Direct execution of certain quantum gates may require a set of qubits positioned in adjacent locations on a quantum computing device. Additionally, execution of these gates may require that special states such as T-states be delivered to and applied to the qubits in question. Complex algorithms may be required to resolve the geometric issues of delivering qubits to proper locations. This makes the execution of such gates both expensive and location dependent.

Further, execution of subsequent gates on any qubit in the set of qubits may be delayed until a previous one is successfully applied. Execution of such gates can be a relatively lengthy process, so executing such a gate directly could cause a delay in the execution of subsequent gates involving these qubits. Direct execution of such a gate could be physically impossible, and indirect gate execution on non-adjacent qubits may exponentially increase computational expenses.

Herein, methods are presented that mitigate both the issues of physical adjacency and delays in execution. Remote execution of an n-qubit gate may be performed by performing local Pauli gates and local joint Pauli measurements on pairs of qubits with pre-established connectivity. With this layout method for a quantum gate, the execution of any diagonal n-qubit gate can be delayed and/or can be performed remotely. This method further enables the pipelining of the execution of commuting diagonal gates even if they act on the same qubits, as the offloading of measurements may free up target qubits before error correction stages are completed.

Further, the execution of such diagonal n-qubit gates often depends on a supply of qubits in special states. These special qubit states are usually produced by state factories positioned in a static location. Remote execution of such gates may thus be performed on a set of qubits located close to such factories rather than on a set located elsewhere in the quantum plane, thus increasing the speed of operations while reducing error rates.

Figure 1:
FIG. 1 shows aspects of an example quantum computer.

For context, aspects of quantum-computer architecture will first be described. Turning now to the drawings, FIG. 1 shows aspects of an example quantum computer 10 configured to execute quantum-logic operations (vide infra). Whereas conventional computer memory holds digital data in an array of bits and enacts bit-wise logic operations, a quantum computer holds data in an array of qubits and operates quantum-mechanically on the qubits in order to implement the desired logic. Accordingly, quantum computer 10 of FIG. 1 includes at least one qubit register 12 comprising an array of qubits 14. The illustrated qubit register is eight qubits in length; qubit registers comprising longer and shorter qubit arrays are also envisaged, as are quantum computers comprising two or more qubit registers of any length.

Qubits 14 of qubit register 12 may take various forms, depending on the desired architecture of quantum computer 10. Each qubit may comprise: an encoding of Majorana quasiparticles and/or other topologically protected quantum systems, a superconducting Josephson junction, a trapped ion, a trapped atom coupled to a high-finesse cavity, an atom or molecule confined within a fullerene, an ion or neutral dopant atom confined within a host lattice, a quantum dot exhibiting discrete spatial- or spin-electronic states, electron holes in semiconductor junctions entrained via an electrostatic trap, a coupled quantum-wire pair, an atomic nucleus addressable by magnetic resonance, a free electron in helium, a molecular magnet, or a metal-like carbon nanosphere, as non-limiting examples. More generally, each qubit 14 may comprise any particle or system of particles that can exist in two or more discrete quantum states that can be measured and manipulated experimentally. For instance, a qubit may be implemented in the plural processing states corresponding to different modes of light propagation through linear optical elements (e.g., mirrors, beam splitters and phase shifters), as well as in states accumulated within a Bose-Einstein condensate.

Figure 2:
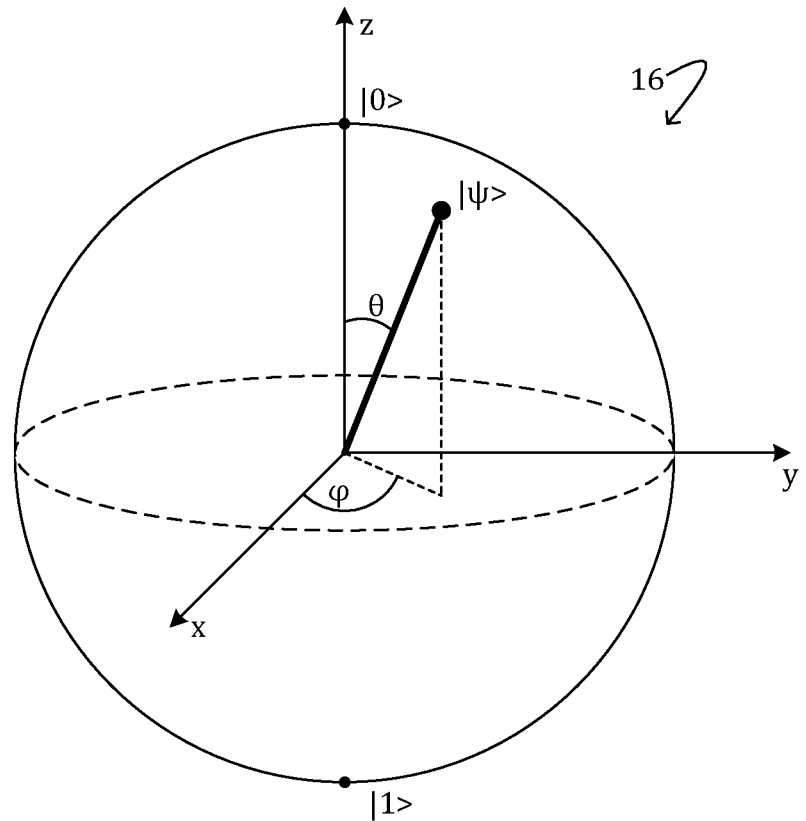
FIG. 2 illustrates a Bloch sphere, which graphically represents the quantum state of one qubit of a quantum computer.

FIG. 2 is an illustration of a Bloch sphere 16, which provides a graphical description of some quantum mechanical aspects of an individual qubit 14. In this description, the north and south poles of the Bloch sphere correspond to the standard basis vectors $|0\rangle$ and $|1\rangle$, respectively—up and down spin states, for example, of an electron or other fermion. The set of points on the surface of the Bloch sphere comprise all possible pure states $|\psi\rangle$ of the qubit, while the interior points correspond to all possible mixed states. A mixed state of a given qubit may result from decoherence, which may occur because of undesirable coupling to external degrees of freedom.

Returning now to FIG. 1, quantum computer 10 includes a controller 18. The controller may include at least one processor 20 and associated computer memory 22. A processor 20 of controller 18 may be coupled operatively to peripheral componentry, such as network componentry, to enable the quantum computer to be operated remotely. A processor 20 of controller 18 may take the form of a central processing unit (CPU), a graphics processing unit (GPU), or the like. As such, the controller may comprise classical electronic componentry. The terms 'classical' and 'nonquantum' are applied herein to any component that can be modeled accurately as an ensemble of particles without considering the quantum state of any individual particle. Classical electronic components include integrated, micro-lithographed transistors, resistors, and capacitors, for example. Computer memory 22 may be configured to hold program instructions 24 that cause processor 20 to execute any function or process of the controller. In examples in which qubit register 12 is a low-temperature or cryogenic device, controller 18 may include control componentry operable at low or cryogenic temperatures—e.g., a field-programmable gate array (FPGA) operated at 77K. In such examples, the low-temperature control componentry may be coupled operatively to interface componentry operable at normal temperatures.

Controller 18 of quantum computer 10 is configured to receive a plurality of inputs 26 and to provide a plurality of outputs 28. The inputs and outputs may each comprise digital and/or analog lines. At least some of the inputs and outputs may be data lines through which data is provided to and/or extracted from the quantum computer. Other inputs may comprise control lines via which the operation of the quantum computer may be adjusted or otherwise controlled.

Controller 18 is operatively coupled to qubit register 12 via quantum interface 30. The quantum interface is configured to exchange data bidirectionally with the controller. The quantum interface is further configured to exchange signal corresponding to the data bidirectionally with the qubit register. Depending on the architecture of quantum computer 10, such signal may include electrical, magnetic, and/or optical signal. Via signal conveyed through the quantum interface, the controller may interrogate and otherwise influence the quantum state held in the qubit register, as defined by the collective quantum state of the array of qubits 14. To this end, the quantum interface includes at least one modulator 32 and at least one demodulator 34, each coupled operatively to one or more qubits of the qubit register. Each modulator is configured to output a signal to the qubit register based on modulation data received from the controller. Each demodulator is configured to sense a signal from the qubit register and to output data to the controller based on the signal. The data received from the demodulator may, in some examples, be an estimate of an observable to the measurement of the quantum state held in the qubit register. Taken together, the controller, modulator, and demodulator may be referred to as a 'controller system'.

In some examples, suitably configured signal from modulator 32 may interact physically with one or more qubits 14 of qubit register 12 to trigger measurement of the quantum state held in one or more qubits. Demodulator 34 may then sense a resulting signal released by the one or more qubits pursuant to the measurement, and may furnish the data corresponding to the resulting signal to controller 18. Stated another way, the demodulator may be configured to output, based on the signal received, an estimate of one or more observables reflecting the quantum state of one or more qubits of the qubit register, and to furnish the estimate to the controller. In one non-limiting example, the modulator may provide, based on data from the controller, an appropriate voltage pulse or pulse train to an electrode of one or more qubits, to initiate a measurement. In short order, the demodulator may sense photon emission from the one or more qubits and may assert a corresponding digital voltage level on a quantum-interface line into the controller. Generally speaking, any measurement of a quantum-mechanical state is defined by the operator O corresponding to the observable to be measured; the result R of the measurement is guaranteed to be one of the allowed eigenvalues of O. In quantum computer 10, R is statistically related to the qubit-register state prior to the measurement, but is not uniquely determined by the qubit-register state.

Pursuant to appropriate input from controller 18, quantum interface 30 may be configured to implement one or more quantum-logic gates to operate on the quantum state held in qubit register 12. Whereas the function of each type of logic gate of a classical computer system is described according to a corresponding truth table, the function of each type of quantum gate is described by a corresponding operator matrix. For example, an n-qubit gate may be represented by a $2^n \times 2^n$ square matrix with entries that are complex numbers. The operator matrix operates on (i.e., multiplies) the complex vector representing the qubit register state and effects a specified rotation of that vector in Hilbert space.

For example, the Hadamard gate H is defined by $$H = \frac{1}{\sqrt{2}}\begin{bmatrix} 1 & 1 \\ 1 & -1 \end{bmatrix} \tag{1}$$

The H gate acts on a single qubit; it maps the basis state $|0\rangle$ to $(|0\rangle+|1\rangle)/\sqrt{2}$, and maps $|1\rangle$ to $(|0\rangle-|1\rangle)/\sqrt{2}$. Accordingly, the H gate creates a superposition of states that, when measured, have equal probability of revealing $|0\rangle$ or $|1\rangle$.

The phase gate S is defined by $$S = \begin{bmatrix} 1 & 0 \\ 0 & e^{i\pi/2} \end{bmatrix}. \tag{2}$$

The S gate leaves the basis state $|0\rangle$ unchanged but maps $|1\rangle$ to $e^{i\pi/2}|1\rangle$. Accordingly, the probability of measuring either $|0\rangle$ or $|1\rangle$ is unchanged by this gate, but the phase of the quantum state of the qubit is shifted. This is equivalent to rotating a wavefunction $|\psi\rangle$ by 90 degrees along a circle of latitude on the Bloch sphere of FIG. 2.

Some quantum gates operate on two or more qubits. The SWAP gate, for example, acts on two distinct qubits and swaps their values. This gate is defined by $$SWAP = \begin{pmatrix} 1 & 0 & 0 & 0 \\ 0 & 0 & 1 & 0 \\ 0 & 1 & 0 & 0 \\ 0 & 0 & 0 & 1 \end{pmatrix}. \tag{3}$$

The foregoing list of quantum gates and associated operator matrices is non-exhaustive, but is provided for ease of illustration. Other quantum gates include Pauli-X, -Y, and -Z gates, the $\sqrt{\text{NOT}}$ gate, additional phase-shift gates, the $\sqrt{\text{SWAP}}$ gate, controlled cX, cY, and cZ gates, and the Toffoli, Fredkin, Ising, and Deutsch gates, as non-limiting examples. Diagonal gates are considered non-trivial gates that include mostly zeros, excepting for the diagonal elements of the matrix.

Single qubit Pauli matrices include the following 4 matrices:

$$I = \begin{pmatrix} 1 & 0 \\ 0 & 1 \end{pmatrix}, X = \begin{pmatrix} 0 & 1 \\ 1 & 0 \end{pmatrix}, Y = \begin{pmatrix} 0 & -i \\ i & 0 \end{pmatrix}, Z = \begin{pmatrix} 1 & 0 \\ 0 & -1 \end{pmatrix} \tag{4}$$

whereas n-qubit Pauli matrices are matrices of the following form:

$$P_1 \otimes P_2 \otimes \ldots \otimes P_n, P_k \in \{I,X,Y,Z\}, k=1, \ldots ,n \tag{5}$$

N-qubit Pauli matrices may be referred to as simply Pauli matrices. Note that Pauli matrices are Hermitian (self-adjoint). In other words, for all P such that P is a Pauli matrix it is the case that $P^\dagger = P$.

Pauli unitaries are matrices of the form $i^k P$, where P is a Pauli matrix, $i=\sqrt{-1}$ and k is an arbitrary integer. Pauli operators are matrices of the form $\pm P$, where P is a Pauli matrix. A multiplication table of Pauli matrices is shown in Table 1. Using this table one can compute the product of two arbitrary Pauli unitaries. For example, row X and column Y contain the product XY=iZ).

TABLE 1

|   | X | Y | Z |
|---|---|---|---|
| X | I | iZ | −iY |
| Y | −iZ | I | iX |
| Z | iY | −iX | I |

As an example, let P be an n-qubit Pauli operator from $\{I,X,Y,Z\}^{\otimes n}$, then $\exp(i\phi P)=I^{\otimes n}\cos(\phi)+i\sin(\phi)P$. This can be proven by first checking that this is true for P=Z and n=1; then, applying the fact that for every Pauli P there exists a Clifford unitary C such that $P=CZ\otimes I^{\otimes(n-1)}C^\dagger$, and that $$C\exp(i\phi Z\otimes I^{\otimes(n-1)})C^\dagger=\exp(i\phi C(Z\otimes I^{\otimes(n-1)})C^\dagger)=I^{\otimes n}\cos(\phi)+i\sin(\phi)P. \tag{6}$$

Alternatively, one can show the same statement using the power series expansions of exp, sin and cos and the fact that the square of every Pauli operator is identity.

Continuing in FIG. 1, suitably configured signal from modulators 32 of quantum interface 30 may interact physically with one or more qubits 14 of qubit register 12 so as to assert any desired quantum-gate operation. As noted above, the desired quantum-gate operations are specifically defined rotations of a complex vector representing the qubit register state. In order to effect a desired rotation O, one or more modulators of quantum interface 30 may apply a predetermined signal level $S_i$ for a predetermined duration $T_i$. In some examples, plural signal levels may be applied for plural sequenced or otherwise associated durations, to assert a quantum-gate operation on one or more qubits of the qubit register. In general, each signal level $S_i$ and each duration $T_i$ is a control parameter adjustable by appropriate programming of controller 18.

The terms 'oracle' and 'quantum program' are used herein to describe a predetermined sequence of elementary quantum-gate and/or measurement operations executable by quantum computer 10. An oracle may be used to transform the quantum state of qubit register 12 to effect a classical or non-elementary quantum-gate operation or to apply a density operator, for example. In some examples, an oracle may be used to enact a predefined 'black-box' operation f(x), which may be incorporated in a complex sequence of operations. To ensure adjoint operation, an oracle mapping n input qubits $|x\rangle$ to m output or ancilla qubits $|y\rangle=f(x)$ may be defined as a quantum gate $O(|x\rangle \otimes |y\rangle)$ operating on the n+m qubits. In this case, O may be configured to pass the n input qubits unchanged but combine the result of the operation f(x) with the ancillary qubits via an XOR operation, such that $O(|x\rangle \otimes |y\rangle)=|x\rangle \otimes |y+f(x)\rangle$. A state-preparation oracle is an oracle configured to generate a quantum state of specified qubit length.

Implicit in the description herein is that each qubit 14 of qubit register 12 may be interrogated via quantum interface 30 so as to reveal with confidence the standard basis vector |0⟩ or |1⟩ that characterizes the quantum state of that qubit. In some implementations, however, measurement of the quantum state of a physical qubit may be subject to error. Accordingly, any qubit 14 may be implemented as a logical qubit, which includes a grouping of physical qubits measured according to an error-correcting oracle that reveals the quantum state of the logical qubit with confidence.

Figure 3:
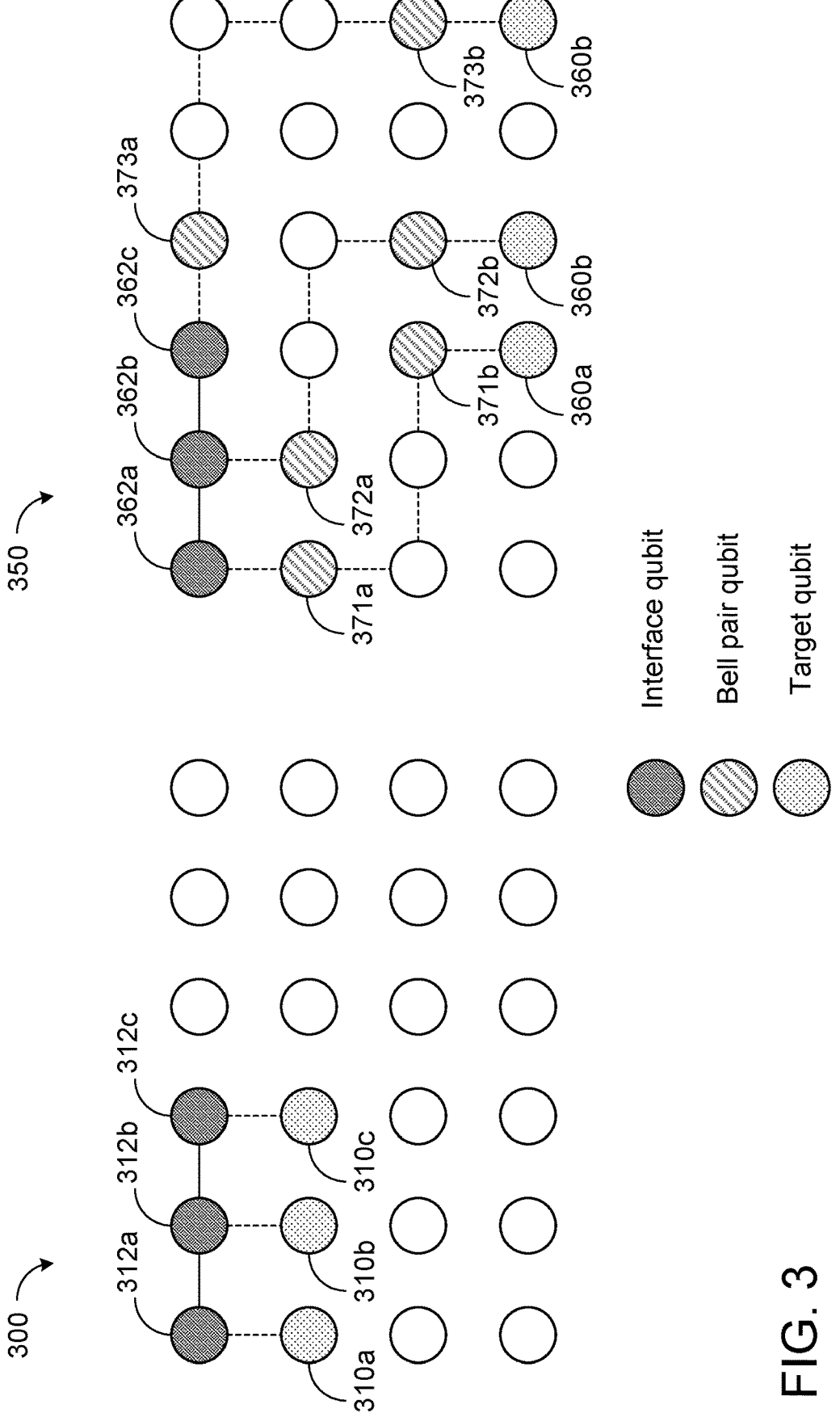
FIG. 3 illustrates example qubit planes.

FIG. 3 shows an example qubit plane 300 where a plurality of qubits are arranged in a grid. In this example a diagonal n-qubit gate is requested where n=3. A set of 3 qubits 310a, 310b, and 310c are identified as target qubits, each physically adjacent to an interface qubit (312a, 312b, and 312c). Joint Z-Z measurements are performed on each pair of qubits (e.g., 310a and 312a, shown connected by a dashed line). The gate may then be performed on the interface qubits based on the Z-Z measurements, followed by performing Pauli corrections.

However, it is possible to execute such diagonal gates on pairs of target/interface qubits even if the qubit pairs are not physically adjacent to each other. Z-Z measurements may be performed on qubits that are located in different parts of the qubit plane provided they share some degree of connectivity. Qubit plane 350 shows example target qubits 360a, 360b, and 360c connected to interface qubits 362a, 362b, and 362c, connected together with dashed lines representing a defined connectivity path. Herein, qubits that share connectivity but are not physically adjacent to each other are referred to as being "remotely" located to each other.

Generally, these connectivity paths may be prepared ahead of time if they share a special state between the pairs. In this example, Bell pairs 371a and 371b, 372a and 372b, and 373a and 373b are presented on qubit plane 350 such that each pair of target and interface qubits share a Bell pair. For example, target qubit 360a and interface qubit 362a share Bell pair 371a and 371b.

For pairs of qubits that share a Bell pair, the joint Z-Z measurement may be performed simply by consuming the Bell pair. This allows for remote gate execution similar to teleportation operations. For additional measurements, the qubits may begin in a "pre-shared" state, where for any 2 qubits, one link is pre-shared ahead of time in order to prepare the circuit to perform remote joint Z-Z measurements. Once the Z gates are applied, the Z measurements may be recorded, and Pauli corrections applied.

However, for some operations, such as swap gates, diagonal gates, Clifford gates, etc., these corrections do not need to be executed immediately. Rather, the corrections may be moved past the gates. As such, the gate execution may be initiated, but there is no need for the target qubit corrections to be completed prior to freeing the target qubits for additional use. As diagonal gates take additional time to execute, this normally would prevent all involved qubits from being reused until the gate is finalized. By moving the correction (e.g., delaying correction) the target qubits may be applied by new gates without waiting for corrections to be finalized. This allows for pipelining of quantum operations.

As an example, FIG. 4A is an example method 400 for operating a quantum computing device. Method 400 may be enacted to enable the remote execution of n-qubit gates within a quantum plane of the quantum computing device.

At 405, method 400 includes receiving a request to execute a first n-qubit gate on a set of n target qubits, the first n-qubit gate representable as an m-qubit diagonal gate conjugated by a Clifford gate, where m≤n. The request may be received at a controller of the quantum computing device, and the set of n target qubits may be defined by the controller. The request may specify particular qubits with appropriate states, properties, characteristics, relative locations, etc. A set of n target qubits that meets these properties may be identified by the controller and used to satisfy the request. n may be an integral number of qubits such that n≥1. Although described predominantly with regard to multi-qubit gates, the systems and methods described herein are applicable to single-qubit gates. For example, The Clifford gate may be any single-qubit or multiple-qubit Clifford gate, including an identity gate. In some examples, the first n-qubit gate may be a diagonal n-qubit quantum gate, such as a CCZ gate. Further examples are described herein and with regard to FIG. 4B.

At 410, method 400 includes identifying a set of m interface qubits on which to perform the m-qubit diagonal gate. The set of m interface qubits may include one or more qubits located remotely from the set of n target qubits. In general, the m interface qubits may be located locally to their corresponding target qubits, remotely, or any combination thereof. As described with regard to FIG. 3, one or more of the interface qubits may not be located adjacent to the target qubits, and may not inherently have connectivity to the target qubits. Rather, one or more of the interface qubits may be located elsewhere on the quantum plane in a place where it is convenient to perform the requested n-qubit gate, e.g., near a source of magic-states, such as T-states. The interface qubits may comprise some, all, or equivalent properties for performing the requested gate that were used to select the target qubits. The interface qubits may be prioritized for assignment for gates that are costly or timely to complete, whereas gates that are relatively easy to execute locally may not be executed remotely, such as H, S, X, Y and Z gates.

At 415, method 400 includes executing a Clifford operation on each interface qubit and its corresponding target qubits. The Clifford operation may include a single or multi-qubit Clifford unitary. In some examples, the Clifford operations executed on the interface qubits and corresponding target qubits are single or multi-qubit Pauli measurements. This may allow for the method to be applied to a wider class of gates, and may allow for the number of interface qubits to be greater than or equal to the number of target qubits. As an example, the multi-qubit Pauli measurements may be executed by using pre-established entanglement as described herein, via Bell pairs, or by any other means.

Additionally or alternatively, the Clifford operations executed on the interface qubits and corresponding target qubits may be multi-qubit Pauli gates X-controlled on the interface qubits. As per multi-qubit Pauli measurements, the multi-qubit Pauli gates X-controlled on the interface qubits may be executed using pre-established entanglement. As an example, an X-controlled multi-qubit Pauli gate may take the form of a Clifford unitary described by the matrix ((I+X)/2)⊗I+((I−X)/2)⊗P, where P is an arbitrary multi-qubit Pauli operation.

FIG. 4B is an example method 450 for operating a quantum computing device. Method 450 may be enacted to enable the remote execution of n-qubit gates within a quantum plane of the quantum computing device for the more specific case of an n-qubit gate that includes one or both of a diagonal gate and a diagonal gate conjugated by a multi-qubit Clifford gate.

At 455, method 450 includes receiving a request to execute a first n-qubit gate on a set of n target qubits, the n-qubit gate including one or both of a diagonal gate and a diagonal gate conjugated by a multi-qubit Clifford gate. As described for method 400, the request may be received at a controller of the quantum computing device, and the set of n target qubits may be defined by the controller. The request may specify particular qubits with appropriate states, properties, characteristics, relative locations, etc. A set of n target qubits that meets these properties may be identified by the controller and used to satisfy the request. n may be an integral number of qubits such that $n \geq 1$.

Generally, if gate D is an n-qubit diagonal gate, and Clifford gate Cis an m-qubit gate, where $m \geq n$ qubits, then the extended method can also execute C $(D \otimes I) C^{-1}$, where I is an (m−n) qubit identity gate.

In some examples, the first n-qubit gate may be a diagonal n-qubit quantum gate, such as a CCZ gate. Other common diagonal gates include, but are not limited to the $R_z$ gate given by the diagonal matrix $\{\{\exp(-i\varphi/2), 0\}, \{0,\exp(i\varphi/2)\}\}$ (1 qubit gates); $R_z$ gates with n control qubits (n+1 qubit gates); Z gates with n control qubits (n+1 qubit gates); $R_1$ gates given by the diagonal matrix $\{\{1,0\}, \{0,\exp(i\varphi/2)\}\}$ (1 qubit gates); $R_1$ gates with n control qubits (n+1 qubit gate); and any S and/or T gates with or without controls. The first n-qubit gate may be executed as part of an algorithm that includes one or more additional gates.

Continuing at 460, method 450 includes identifying a set of n interface qubits on which to perform the first n-qubit gate, the set of n interface qubits including one or more qubits located remotely from the set of n target qubits. As described with regard to FIGS. 3 and 4A, one or more of the interface qubits may not be located adjacent to the target qubits, and may not inherently have connectivity to the target qubits. Rather, one or more of the interface qubits may be located elsewhere on the quantum plane in a place where it is convenient to perform the requested n-qubit gate, e.g., near a source of magic-states, such as T-states. The interface qubits may comprise some, all, or equivalent properties for performing the requested gate that were used to select the target qubits. The interface qubits may be prioritized for assignment for gates that are costly or timely to complete, whereas gates that are relatively easy to execute locally may not be executed remotely, such as H, S, X, Y and Z gates.

At 465, method 450 includes executing a joint Z-Z measurement on each target qubit and its corresponding interface qubit via a pre-established entanglement. In some examples, a multi-qubit Pauli measurement is made in addition to or as an alternative to the joint Z-Z measurement. This may allow for the method to be applied to a wider class of gates, and may allow for the number of interface qubits to be greater than or equal to the number of target qubits.

As one example, the method may include establishing a set of n Bell pairs, such that a first qubit of each Bell pair is positioned locally to a first qubit of the n target qubits, and a second qubit of the Bell pair is located remotely at a first qubit of the n interface qubits. In this way, the quantum computing device is effectively executing joint Z-Z measurement between target and interface qubits via the Bell-pair.

For example, the first qubit of each Bell pair may be positioned adjacent to or otherwise with connectivity to a target qubit, and the second qubit of the Bell pair may be positioned adjacent to or otherwise with connectivity to an interface qubit, thereby establishing connectivity between a target qubit and a corresponding non-adjacently located interface qubit. The Bell pairs may be established based on the inputs to the gate, a description of the underlying qubit plane fabric (qubit connectivity), and properties of the requested gate. In some examples, the acts of identifying target qubits, identifying interface qubits, and establishing Bell pairs may be performed in any order, in parallel, or otherwise independent of each other. For example, Bell pairs can be prepared well in advance, allowing for parallelization of executing the method. At 470, method 450 includes executing the first n-qubit gate on the set of n interface qubits.

At 475, method 450 includes performing classical tracking and corrections on at least the set of n target qubits and the set of n interface qubits. As an example, method 450 may include identifying, via classical tracking, one or more qubits within the set of n target qubits to which Z correction is indicated. Responsive to completing the execution of the first n-qubit gate on the set of n interface qubits, spin may be measured along X on the set of n interface qubits. Measured spin values for X may be stored, and then one or more qubits within the set of n interface qubits to which Z correction is indicated may be identified. Z correction may then be performed on at least the identified target qubits and the identified interface qubits. In some examples, multi-qubit Pauli corrections may be performed in addition to or as an alternative to Z corrections. In some examples, Z correction may also be performed on any related qubits based on the classical results previously obtained and/or on collected tracking data. For example, if, while the first n-qubit gate was executing, the user's algorithm was simultaneously performing operations involving the identified target qubit and any other data qubits, then Z correction may be applied to those related data qubits. Once Z corrections are delayed, they can be spread to other qubits. A set of such related qubits may be tracked classically.

FIG. 5A is an example method 500 for operating a quantum computing device. Method 500 may be enacted to enable the delayed execution of n-qubit gates within a quantum plane of the quantum computing device. Method 500 may be performed in conjunction with, as an extension of, or independently of methods 400 and/or 450.

At 505, method 500 includes receiving a request to execute a first n-qubit gate on a set of n target qubits, the first n-qubit gate representable as an m-qubit diagonal gate conjugated by a Clifford gate, where $m \leq n$. The request may be received at a controller of the quantum computing device, and the set of n target qubits may be defined by the controller. As described with regard to method 400, n may be an integral number of qubits such that $n \geq 1$. Continuing at 510, method 500 includes identifying a set of m interface qubits on which to perform the m-qubit diagonal gate.

At 515, method 500 includes executing a Clifford operation on each interface qubit and its corresponding target qubits. As described with regard to method 400, in some examples, the Clifford operations executed on interface qubits and corresponding target qubits are multi-qubit Pauli measurements. The multi-qubit Pauli measurements may be executed by using pre-established entanglement as described with regard to FIGS. 4A-4B. Additionally or alternatively, the Clifford operations executed on interface qubits and corresponding target qubits may be multi-qubit Pauli gates X-controlled on the interface qubits. The multi-qubit Pauli gates X-controlled on the interface qubits may be executed using pre-established entanglement. Continuing at 520, method 400 includes executing the m-qubit diagonal gate on the set of m interface qubits.

At 525, method 500 includes performing computations on one or more of the n target qubits prior to completion of the execution of the m-qubit diagonal gate on the set of m interface qubits. This may allow for parallel execution of gates which are assigned to the same set of target qubits.

Optionally, at 530, method 500 includes receiving a request to execute an n'-qubit gate on a set of n' target qubits, the set of n' target qubits including one or more of the set of n target qubits. n' may be equal to n, or may be a larger or smaller integer.

Optionally, at 535, method 500 includes initiating execution of the n'-qubit gate on the set of n' target qubits prior to completion of the execution of the m-qubit diagonal gate on the set of m interface qubits. In other words, the second n-qubit gate can be executed without waiting for Pauli corrections on target qubits. Gates that can be initiated prior to completion of the execution of the diagonal gates on the interface qubits include, but are not limited to any combination of SWAP, Pauli, parity measurements and diagonal gates; and any combination of Clifford, SWAP, multi-qubit Pauli measurements and Pauli gates (SWAP and Pauli gates are special case of Clifford gates). Gates that are locally executed, such as Clifford and SWAP gates may be executed on the set of n target qubits.

Executing n'-qubit gates on the set of n' target qubits may include executing a Clifford operation on each interface qubit and its corresponding target qubits. As described above, the Clifford operations executed on interface qubits and corresponding target qubits may include multi-qubit Pauli measurements and/or multi-qubit Pauli gates X-controlled on the interface qubits. Any combination of the multi-qubit Pauli measurements and/or multi-qubit Pauli gates X-controlled on the interface qubits may be executed by using pre-established entanglement.

In some examples, method 500 further comprises identifying one or more qubits within the set of n target qubits and n' target qubits to which multi-qubit Pauli correction is indicated. Responsive to completing the execution of the m-qubit diagonal gate on the set of m interface qubits, spin may be measured along X on the set of m interface qubits. Measured spin values for X may then be stored. Multi-qubit Pauli corrections may be performed on at least one or more of the identified target qubits. The multi-qubit Pauli corrections may be performed by using pre-established entanglement.

FIG. 5B is an additional example method 550 for operating a quantum computing device. Method 550 may be enacted to enable the delayed execution of n-qubit gates within a quantum plane of the quantum computing device. Method 550 may be considered a related case of method 500 for examples where the n-qubit gate includes one or both of a diagonal gate and a diagonal gate conjugated by a multi-qubit Clifford gate. Method 550 may be performed in conjunction with, as an extension of, or independently of methods 400, 450, and/or 500.

At 555, method 550 includes receiving a request to execute a first n-qubit gate on a set of n target qubits, the n-qubit gate including one or both of a diagonal gate and a diagonal gate conjugated by a multi-qubit Clifford gate. The request may be received at a controller of the quantum computing device, and the set of n target qubits may be defined by the controller. As described with regard to method 500, n may be an integral number of qubits such that n≥1. Continuing at 560, method 550 includes identifying a set of n interface qubits on which to perform the first n-qubit gate. In this example, each interface qubit may be located either local to or remotely from its corresponding target qubit.

At 565, method 550 includes executing a joint Z-Z measurement on each target qubit and its corresponding interface qubit. Such measurements may be performed by any suitable means, such as, but not limited to, the methods described with regard to 465 of FIG. 4B. In some examples, a multi-qubit Pauli measurement is made in addition to or as an alternative to the joint Z-Z measurement. At 570, method 550 includes executing the first n-qubit gate on the set of n interface qubits.

At 575, method 550 includes performing computations on one or more of the n target qubits prior to completion of the execution of the first n-qubit gate on the set of n interface qubits. This allows for parallel execution of gates which are assigned to the same set of target qubits. Performing computations on one or more of the n target qubits may occur in response to execution of the joint Z-Z measurement on each target qubit and its corresponding interface qubit, and/or associated Bell pair, as described with regard to FIG. 4B.

At 580, method 550 includes receiving a request to execute a second n-qubit gate on the set of n target qubits. As described with regard to method 500, the second n-qubit gate can be executed without waiting for Pauli corrections on target qubits. Gates that can be initiated prior to completion of the execution of the diagonal gates on the interface qubits include, but are not limited to any combination of SWAP, Pauli, parity measurements and diagonal gates; and any combination of Clifford, SWAP, multi-qubit Pauli measurements and Pauli gates (SWAP and Pauli gates are special case of Clifford gates). Gates that are locally executed, such as Clifford and SWAP gates may be executed on the set of n target qubits.

As such, at 585, method 550 includes, initiating execution of the second n-qubit gate on the set of n target qubits prior to completion of the execution of the first n-qubit gate on the set of n interface qubits. In examples where one or more interface qubits are also target qubits, such a qubit may not be reused until execution of the first n-qubit gate is completed. If, according to the presiding algorithm, such a qubit is not needed initially for the second n-qubit gate, execution of the second n-qubit gate may still be initiated prior to completion of execution of the first n-qubit gate.

At 590, method 500 includes performing classical tracking and corrections on at least the set of n target qubits and the set of n interface qubits, as described with regard to 475 of FIG. 4B. Such tracking may be performed while computation on the target qubits is ongoing as described at 575.

Using the methods described herein, the execution of any diagonal n-qubit gate can be delayed, performed remotely, or both. Remote execution can be performed by consuming n Bell states and performing local Pauli gates and local joint Pauli measurements. As an example, this approach can be demonstrated using the case of delayed remote execution of a CCZ gate, which is performed by consuming three Bell pairs. One skilled in the art will recognize that the following proof for the CCZ gate is applicable to the general case of any n-qubit diagonal gate or m-qubit diagonal gate conjugated by an n-qubit Clifford gate, where m is an integer and m≤n. with modest changes for the selected gate.

Figure 6A:
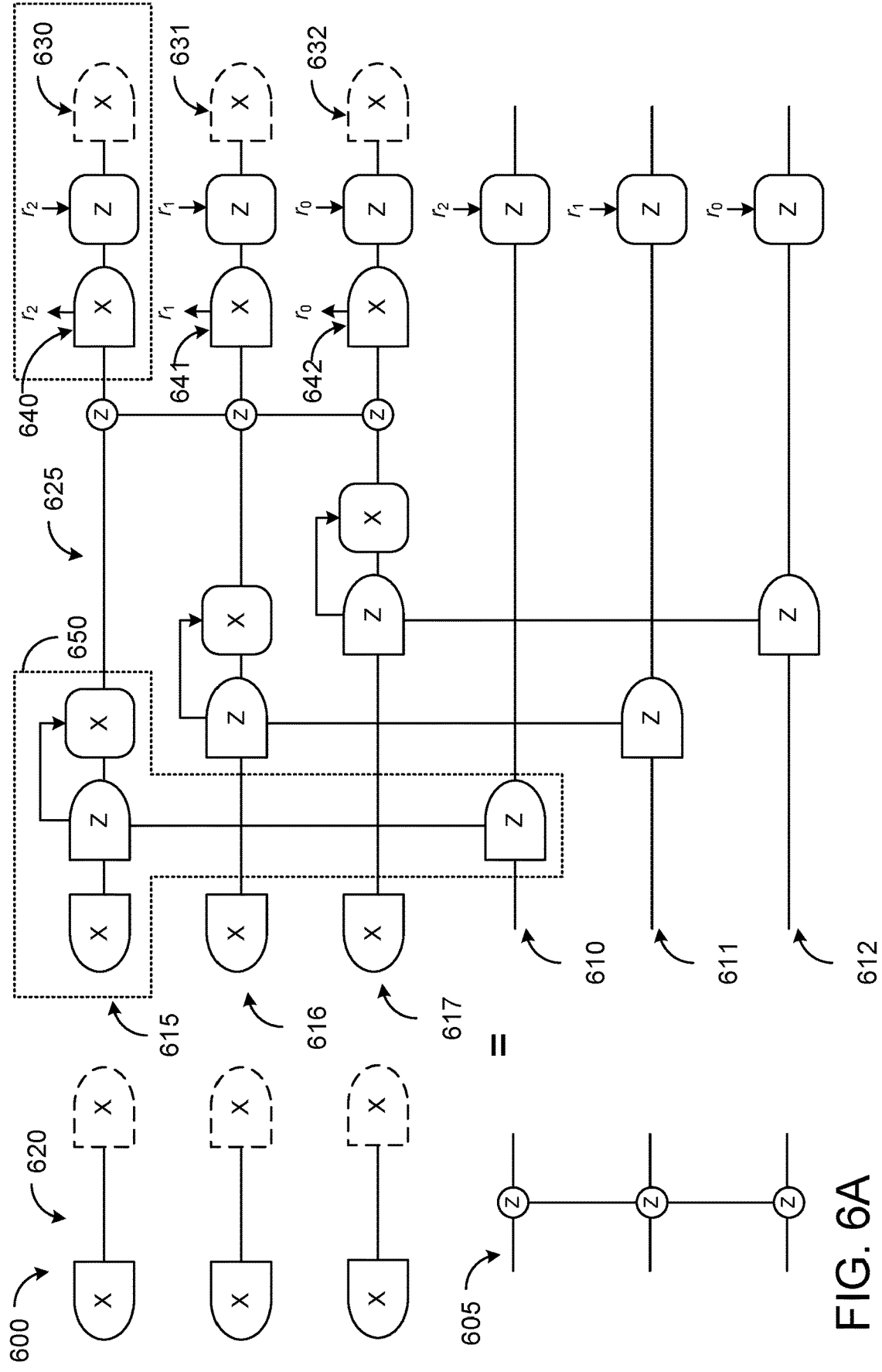
FIG. 6A schematically shows an example quantum circuit for the delayed remote execution of a CCZ gate.

FIG. 6A shows an example circuit 600 for the delayed remote execution of a CCZ gate 605 on three target qubits (610, 611, 612) via three interface qubits (615, 616, 617). Left hand side 620 represents a classical CCZ gate, whereas right hand side 625 represents a delayed, remotely execute CCZ gate. Gates labeled "X" and surrounded by dashed lines (630, 631, 632) positioned on the right hand side of circuit 600 indicate that the state of each of three target qubits (610, 611, 612) is +1 eigenstate of X. Arrows extending from qubits labeled X and surrounded by solid lines (640, 641, 642) directing into a register ($r_0$, $r_1$, $r_2$) indicates that the measurement outcome for the respective qubit is written to the indicated register. Arrows directed into a Pauli X or Pauli Z gate show that the gate is executed if a corresponding measurement outcome or recorded register value is +1. As shown here, the circuit on the right side of FIG. 6 (625) executes a CCZ gate as summarized by the following proposition:

Proposition 1.1: Circuits 620 and 625, as illustrated in FIG. 6 are equivalent. The circuit on the right-hand side (circuit 625) executes a CCZ gate (605) on three interface qubits (615, 616, 617) and returns the target qubits (610, 611, 612) back to +1 eigenstate of Pauli X.

Figure 6B:
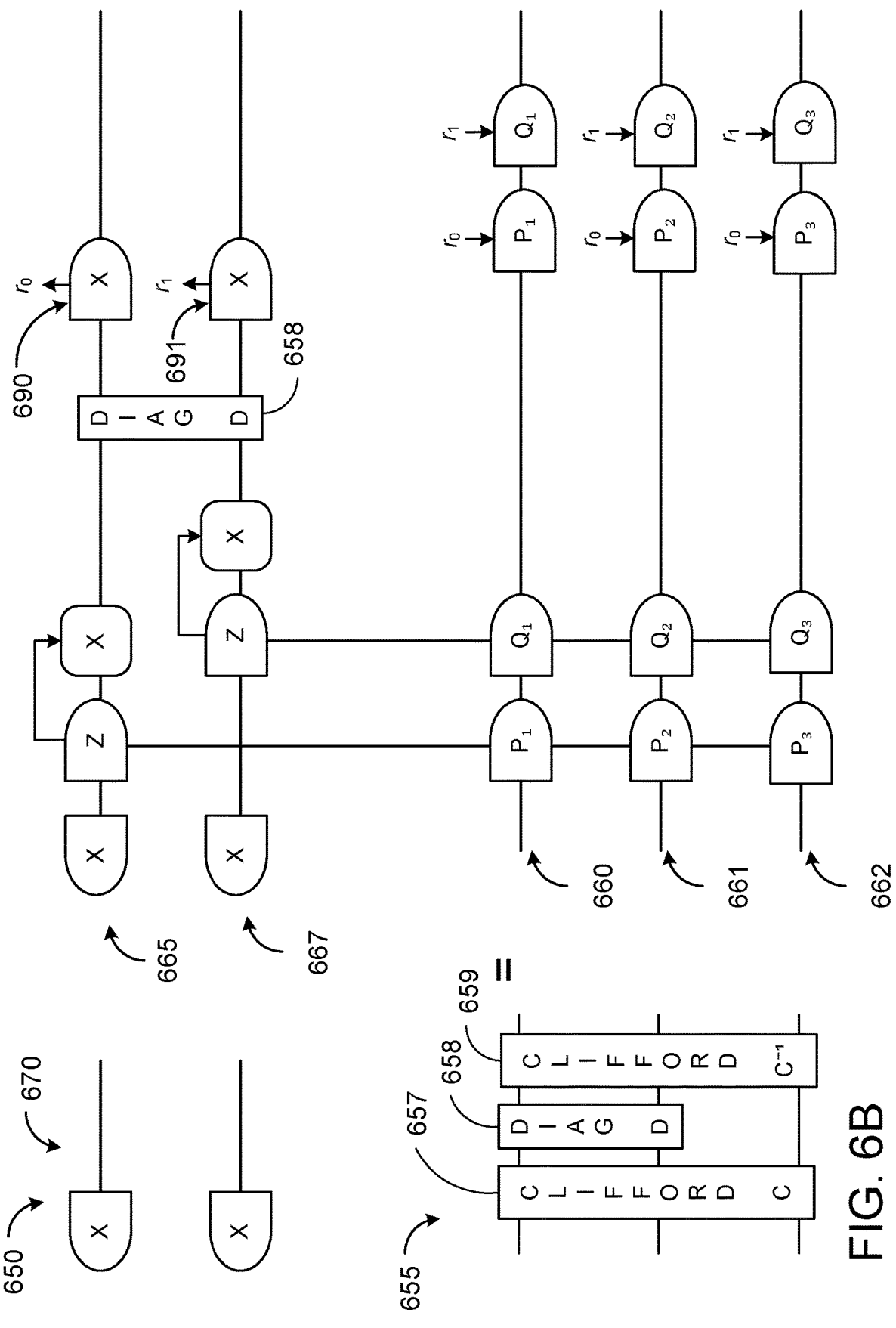
FIG. 6B schematically shows an example quantum circuit for executing an n-qubit gate.

A more generalized circuit 650 is shown in FIG. 6B. Circuit 650 may be employed for delayed and/or remote execution of a series of gates 655, including a three-qubit Clifford gate (C) 657, a two-qubit diagonal gate (D) 658, and a three-qubit inverse Clifford gate (C$^{-1}$) 659. Circuit 650 enables execution of the conjugated diagonal gate 655 on three target qubits (660, 661, 662) via two interface qubits (665, 667). The diagonal gate 655 may be executed on the two interface qubits 665 and 667. As shown at 690 and 691, the measurement outcome for the respective qubit is written to the indicated register ($r_0$, $r_1$). As per FIG. 6A, arrows directed into a Pauli X or Pauli Z gate show that the gate is executed if a corresponding measurement outcome or recorded register value is +1. $P_1$, $P_2$, & $P_3$, and $Q_1$, $Q_2$, & $Q_3$ are determined by Clifford gate 657 and can be any one of the set of {Identity, X, Y, Z}.

As described with regard to FIG. 3, the target qubits (610, 611, 612)) and interface (615, 616, 617) qubits in circuit 600 of FIG. 6 can be located in different parts of a quantum computer. To execute a CCZ gate on the interface qubits (616, 617, 618) it is sufficient to perform pair-wise joint Z⊗Z measurements. Each such measurement can be performed by consuming a Bell pair, hence remote execution. Moreover, the computation on the interface qubits (616, 617, 618) can continue before the values of measurement outcomes stored in $r_0$, $r_1$, $r_2$ are known. For example, if the CCZ gate is followed by a Clifford gate, then the Pauli corrections are transformed into some other Pauli correction by the Clifford gate. Hence, the execution of the gate is delayed. This method for delayed remote execution also allows for the pipelining of the execution of commuting diagonal gates even if they act on the same qubits.

This result may be shown by using a series of circuit transformations, illustrated in FIGS. 7-16. The proof comprises three main stages. First, all the measurements in the circuit are replaced with ±π/4 exponents of Pauli operators $$\exp\left(\pm i\frac{\pi}{4} Y \otimes Z\right).$$

This is possible due to additional information known about Pauli operators that stabilize the state during computation. Second, the CCZ gate is decomposed as a product of seven Pauli exponents, showing that the overall circuit applies the product of seven different Pauli exponents to all six qubits. This follows from the fact that the conjugation of a general exponent of a Pauli operator by π/4 exponents of Pauli operators is equal to another exponent of a Pauli operator. Finally, it may be demonstrated that these new exponents of Pauli operators act on all six qubits in the same fashion as seven exponents of Pauli operators acting solely on the bottom three qubits. The action of the different exponents is equivalent because the top three qubits are initialized to +1 eigenstate of X This is due to the fact that different Pauli exponents can act on the state in the same way, if the state is +1 eigenstate of a Pauli operator. The seven exponents acting on the bottom three qubits are equal to the decomposition of the CCZ gate into the exponents of Pauli operators.

Returning to FIG. 6, a portion 650 of circuit 600 is indicated with dashed lines. FIG. 7 shows a circuit identity 700 that may be applied to portion 650. Circuit identity 700 illustrates the equivalence of a Z⊗Z measurement 710 and a Pauli exponent $$\exp\left(i\frac{\pi}{4} y \otimes Z\right) \, 720.$$

The connected pair of Zs (725) shown in dashed lines on the very right of the circuit 720 demonstrate that the final state is +1 eigenstate of Z⊗Z. Such gates may be referred to as assertion gates.

Proposition 1.2: Let |ψ⟩ be an n-qubit state and let Pauli operator Q stabilize |ψ⟩, that is Q|ψ⟩=|ψ⟩. Consider n-qubit Pauli operator P that anti-commutes with Q. Then, the measurement of P with correction Q upon −1 outcome is equivalent to applying unitary I+PQ/√2. The probability of the measurement outcome is ½ and the resulting state is stabilized by P.

To prove this, first it is determined whether measuring P gives either outcome +1 or −1 with a probability of ½. Indeed, the probability of measuring +1 is $$\frac{\langle\psi|I + P|\psi\rangle}{2} = \frac{\langle\psi|I - P|\psi\rangle}{2}$$

and it is equal to:

$$\frac{\langle\psi|Q(I + P)Q|\psi\rangle}{2} = \frac{\langle\psi|I + QPQ|\psi\rangle}{2} = \frac{\langle\psi|I - P|\psi\rangle}{2} \tag{7}$$

Thus, the probability of measuring +1 and −1 is the same and their sum is one. Therefore, the probability of each measurement outcome is ½. This means that in the case of a +1 outcome the state becomes (I+P)|ψ⟩/√2 which is equal to (I+PQ)|ψ⟩/√2, which is a Clifford unitary. Similarly, in case of a −1 outcome, (I−PQ)|ψ⟩I/√2 can be applied. After applying correction Q upon outcome −1, the state becomes Q(I−PQ)|ψ⟩/√2=(I+PQ)|ψ⟩/√2. The correction forces the result back to +1 measurement outcome and therefore the result is stabilized by P.

Because P and Q in the proposition above anti-commute, there exist P' from {I,X,Y,Z}$^{\otimes n}$ such that PQ=±iP' and therefore $$\frac{I + PQ}{\sqrt{2}} = \exp\left(\pm i\frac{\pi}{4} P'\right).$$

Figure 8:
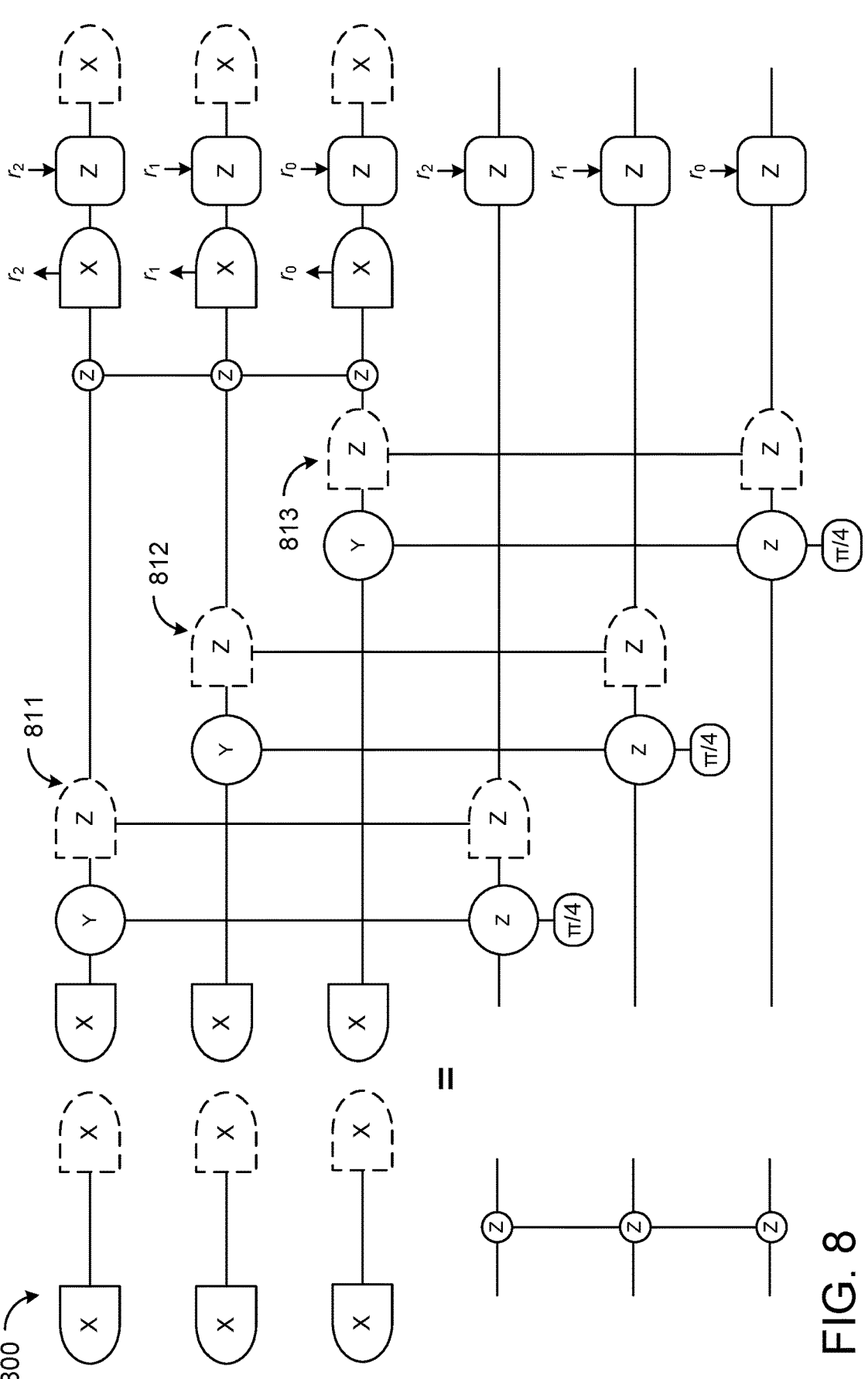
FIG. 8 schematically shows the example quantum circuit of FIG. 6 following application of the identity circuit of FIG. 7.

Applying the circuit identity 700 from FIG. 7 to circuit 625 from FIG. 6 allows for the replacement of the first three Z⊗Z measurements with π/4 Pauli exponents and leads to the example quantum circuit 800 shown in FIG. 8, resulting in a circuit with three Z⊗Z assertion gates (811, 812, 813).

The Z⊗Z assertion gates (811, 812, 813) in circuit 800 can be commuted past a CCZ gate, and similarly past any diagonal gate. This leads to the circuit diagram 900 shown in FIG. 9 including three assertion gates (911, 912, 913). FIG. 10 shows another quantum circuit identity 1000, demonstrating the equivalence of measurement (1010) and Pauli exponents (1020). The connected pair of Zs (1025) on the very left of the diagram indicates that the initial state is stabilized by Z⊗Z.

Figure 9:
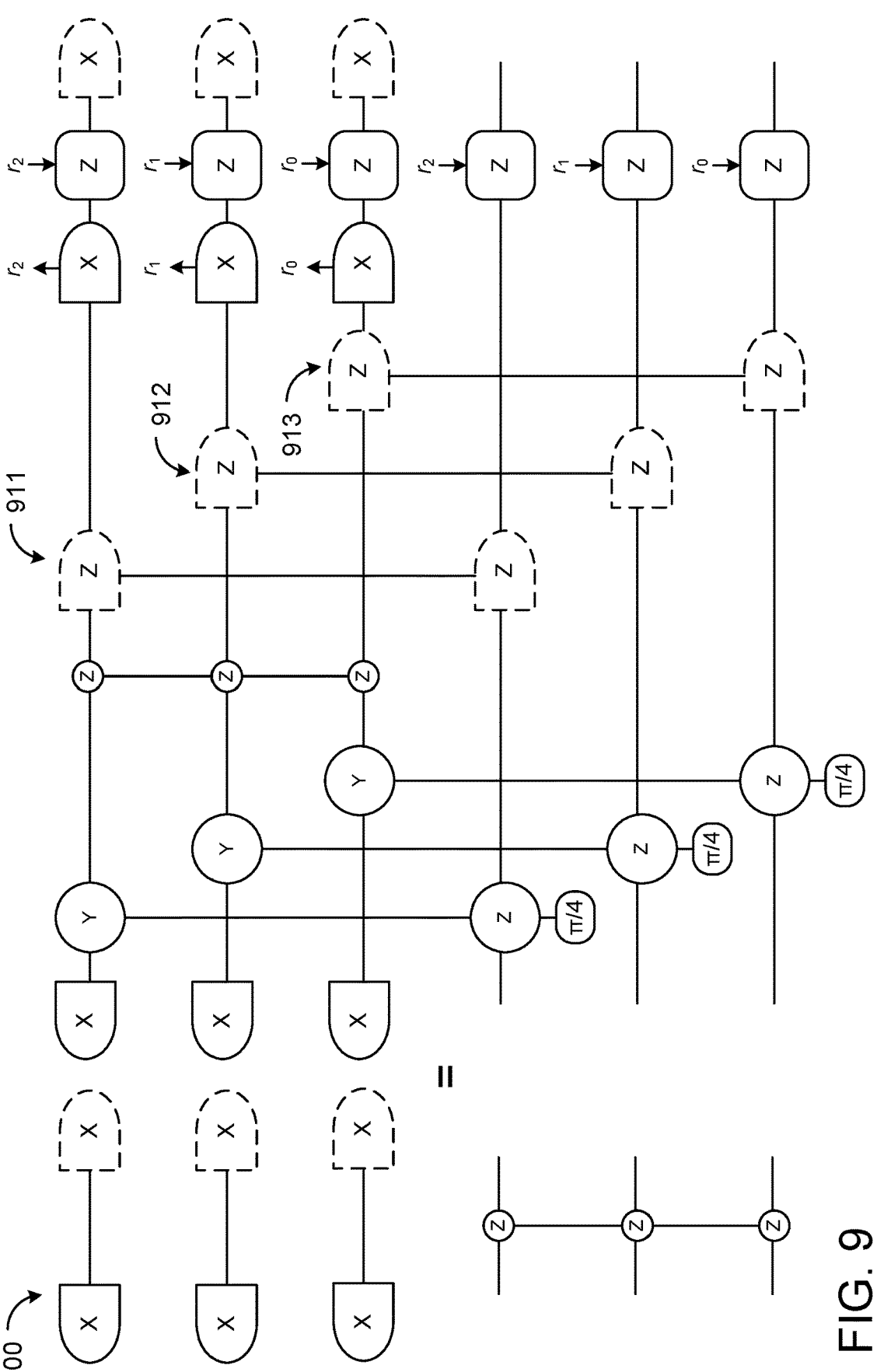
FIG. 9 schematically shows the example quantum circuit of FIG. 8, following commuting assertion gates past the CCZ gates.
Figure 10:
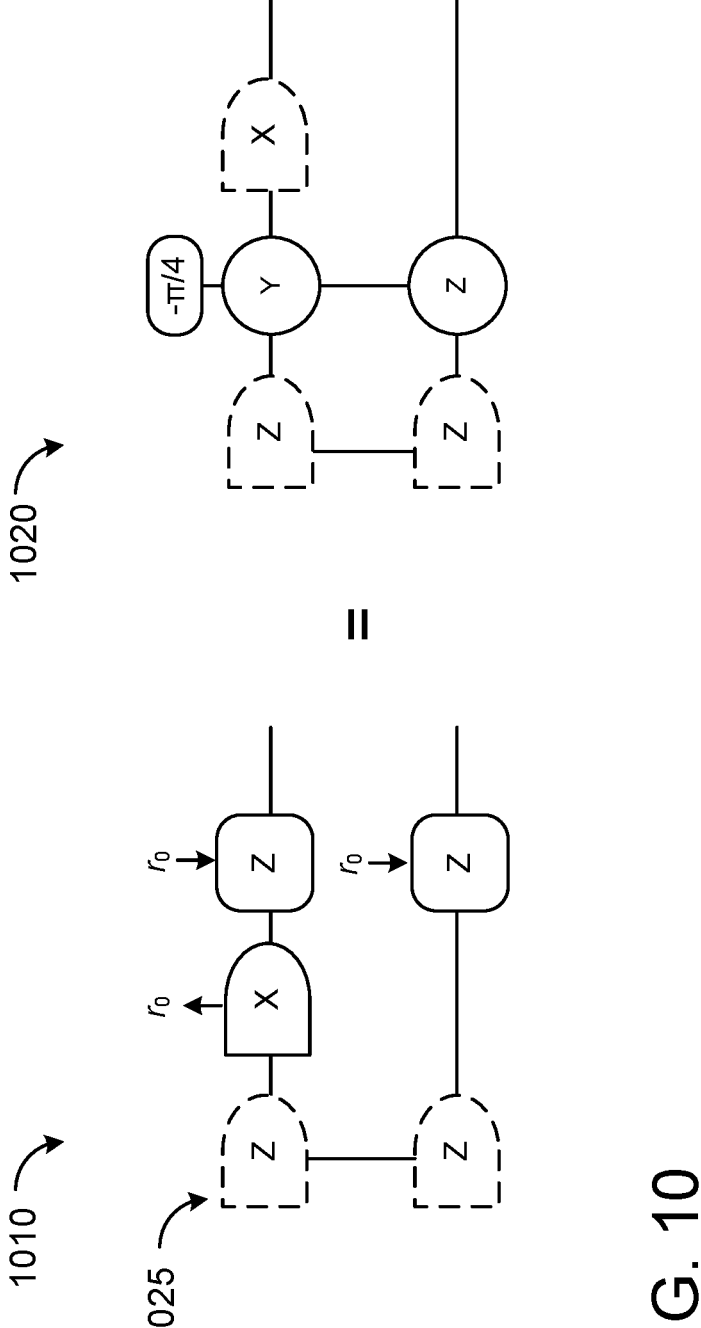
FIG. 10 schematically shows an example quantum circuit identity.
Figure 11:
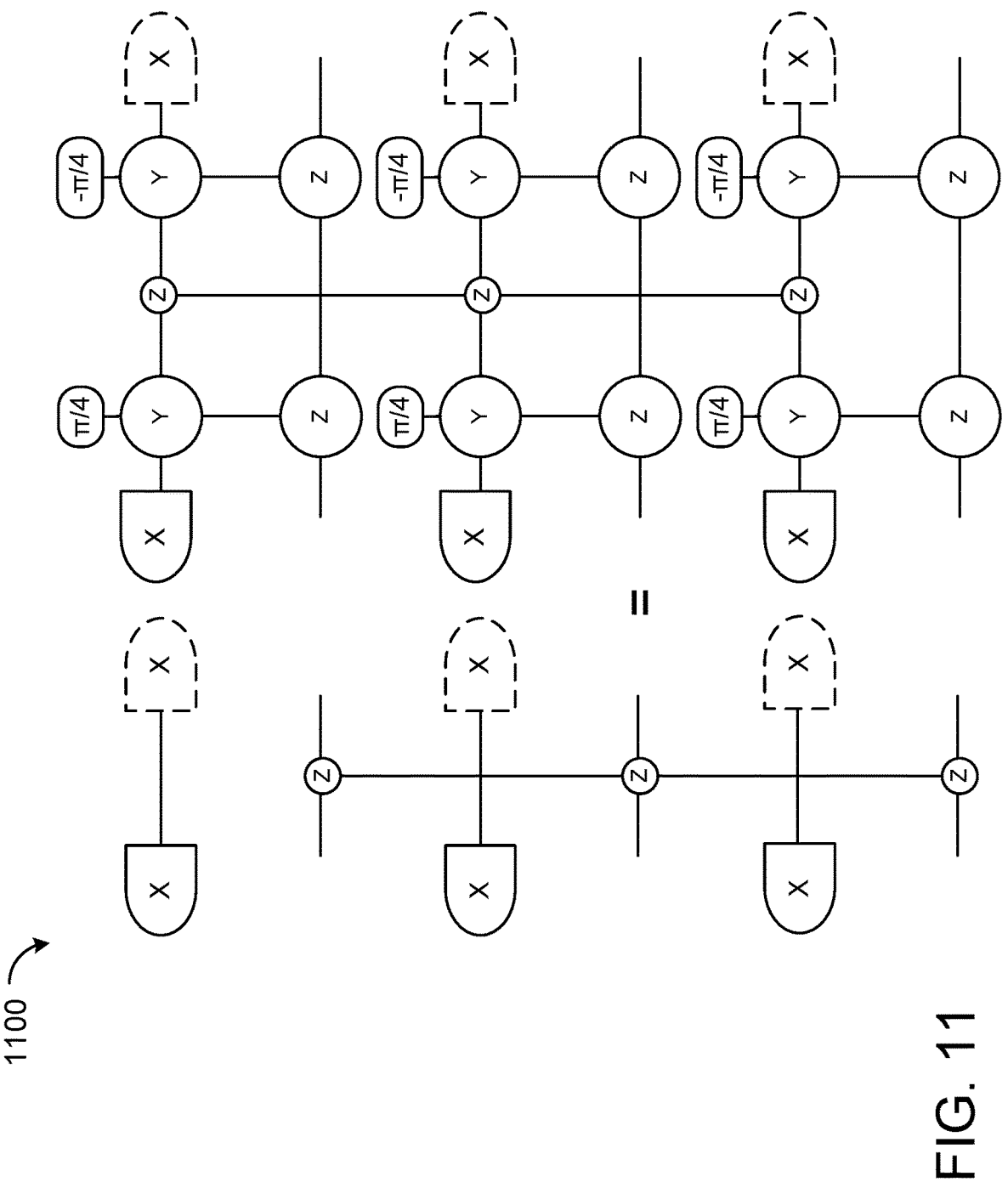
FIG. 11 schematically shows the example quantum circuit of FIG. 9 following application of the identity circuit of FIG. 10.

This circuit identity 1000 may be applied to the assertion gates 911, 912, and 913 as shown in FIG. 9 as well as to the other similar sub-circuits. This replaces the remaining X measurements with −π/4 Pauli exponents. The circuit identity shown in FIG. 10 is similar to the one shown in FIG. 7, following from Proposition 1.2. The result of X measurement replacement is shown in FIG. 11, with circuit 1100 indicating the result of applying the identity of FIG. 10 to FIG. 9 and reordering qubits.

The next step is to represent the CCZ gate as a product of seven exponents of Pauli operators, as described in the below proposition 1.3 and illustrated by circuit 1200 in FIG. 12, which shows the decomposition of the CCZ gate as a product of Pauli exponents.

Proposition 1.3: Twice controlled-Z gate CCZ can be represented as:

$$\prod_{P \in \langle -Z_1, -Z_2, -Z_3 \rangle} \exp\left(i\frac{\pi}{8}P\right) \tag{8}$$

where $\langle -Z_1, -Z_2, -Z_3 \rangle$ is the Abelian group generated by $-Z_1 = -Z \otimes I \otimes I, -Z_2 = -I \otimes Z \otimes I, -Z_3 = -I \otimes I \otimes Z$.

To prove this, the CCZ gate may be written as $\exp(i\pi|111\rangle\langle 111|)$, then using the fact that $|1\rangle\langle 1| = (1-Z)/2$ it can be seen that:

$$\exp(i\pi|111\rangle\langle 111|) = \exp\left(i\frac{\pi}{8}(I - Z) \otimes (I - Z) \otimes (I - Z)\right). \tag{9}$$

Here, $(I-Z) \otimes (I-Z) \otimes (I-Z) = \sum_{P \in \langle -Z_1, -Z_2, -Z_3 \rangle} P$. Using the fact that for commuting matrices A and B $\exp(A+B) = \exp(A)\exp(B)$ completes the proof. It may also be noted that any n-qubit diagonal gate can be written as $$\prod_{P \in \langle Z_1, Z_2, \dots, Z_n \rangle} \exp(i\phi_P P) \tag{10}$$

for appropriate choice of phases $\phi_P$. It is useful to keep this in mind to see how this proof for CCZ gates generalizes to arbitrary n-qubit gates.

Figure 13:
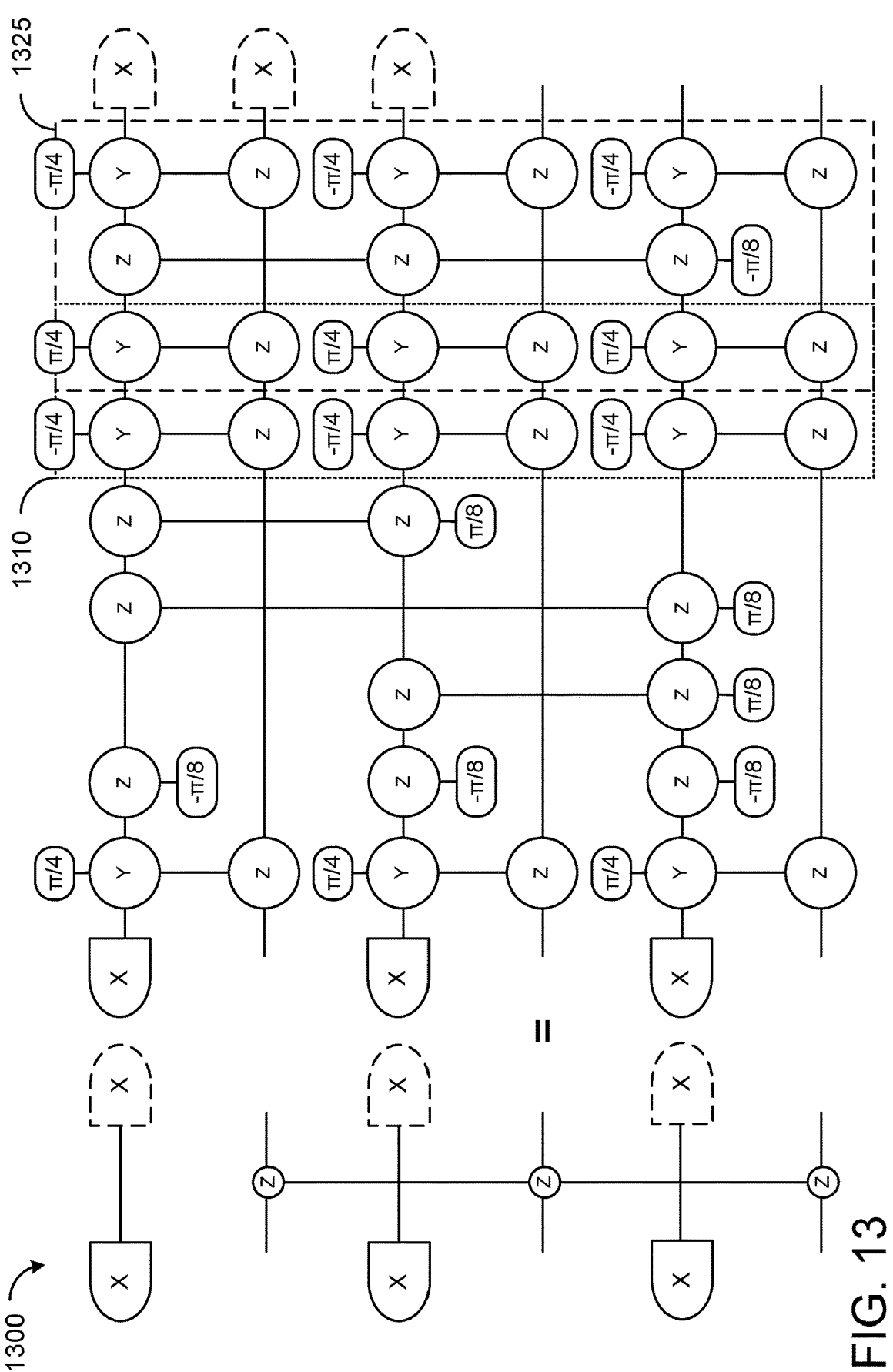
FIG. 13 schematically shows the example quantum circuit of FIG. 11 with a decomposed CCZ gate as shown in FIG. 12.

Using the decomposition for CCZ gate leads to the quantum circuit 1300 shown in FIG. 13, where the quantum circuit 1100 is converted by replacing the CCZ gate with its decomposition in terms of exponents of Pauli operators. Further, circuit 1300 includes inserted Pauli exponent gates that cancel each other, as shown at 1310.

Proposition 1.4: Let P and Q be n-qubit Pauli operators. Then $$\exp\left(i\frac{\pi}{4}P\right)Q\exp\left(-i\frac{\pi}{4}P\right)$$

is equal to Q if P and Q commute, and is equal to iPQ otherwise. Similarly, $$\exp\left(i\frac{\pi}{4}P\right)$$

$$\exp(i\phi Q)$$

$$\exp\left(-i\frac{\pi}{4}P\right)$$

is equal to $\exp(i\phi Q)$ if P and Q commute, and is equal to $\exp(i\phi(iPQ))$ otherwise.

As proof, if P and Q commute, then $$\exp\left(i\frac{\pi}{4}P\right)$$

and Q also commute. This implies that $$\exp\left(i\frac{\pi}{4}P\right)Q\exp\left(-i\frac{\pi}{4}P\right) = \exp\left(i\frac{\pi}{4}P\right)\exp\left(-i\frac{\pi}{4}P\right)Q = Q. \tag{11}$$

If P and Q do not commute, they must anti-commute, therefore $$\exp\left(i\frac{\pi}{4}P\right)Q\exp\left(-i\frac{\pi}{4}P\right) = \frac{I+iP}{\sqrt{2}}Q\frac{I-iP}{\sqrt{2}} = \frac{(I+iP)^2 Q}{2} = \frac{2iPQ}{2} = iPQ \tag{12}$$

because for any matrices A, B $A \exp(B)A^{-1} = \exp(ABA^{-1})$, part of the result for $\exp(i\phi Q)$ is established.

Figure 14:
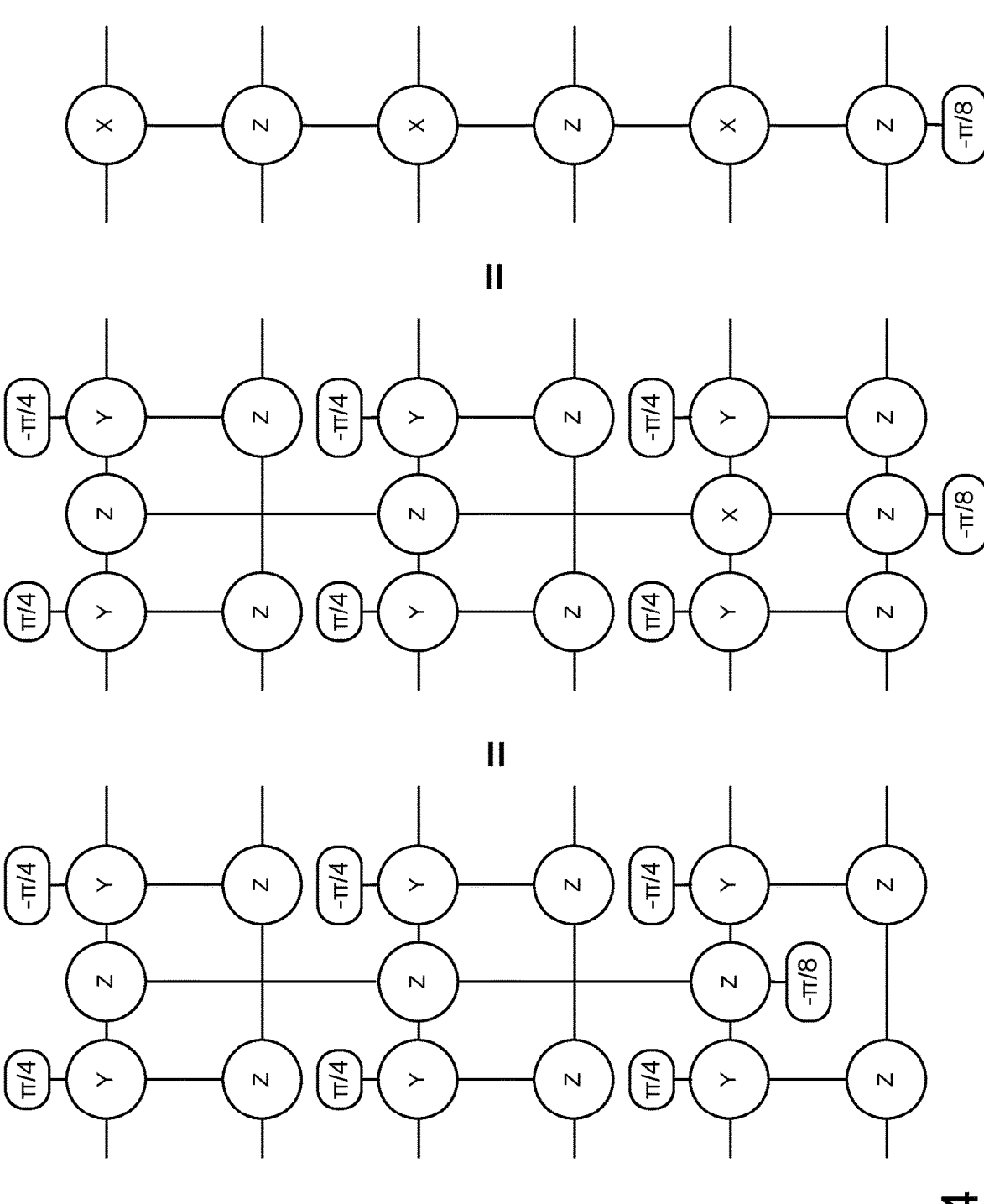
FIG. 14 schematically shows an example quantum circuit identity.

FIG. 14 schematically shows an example identity circuit 1400 that follows from Proposition 1.4, showing how conjugation by π/4 Pauli exponents transforms other Pauli exponents. This identity may be applied to the outlined portion 1325 of circuit 1300 by inserting the Pauli exponent gates.

Figure 15:
FIG. 15 schematically shows the example quantum circuit of FIG. 13 following application of the identity circuit of FIG. 14.
Figure 16:
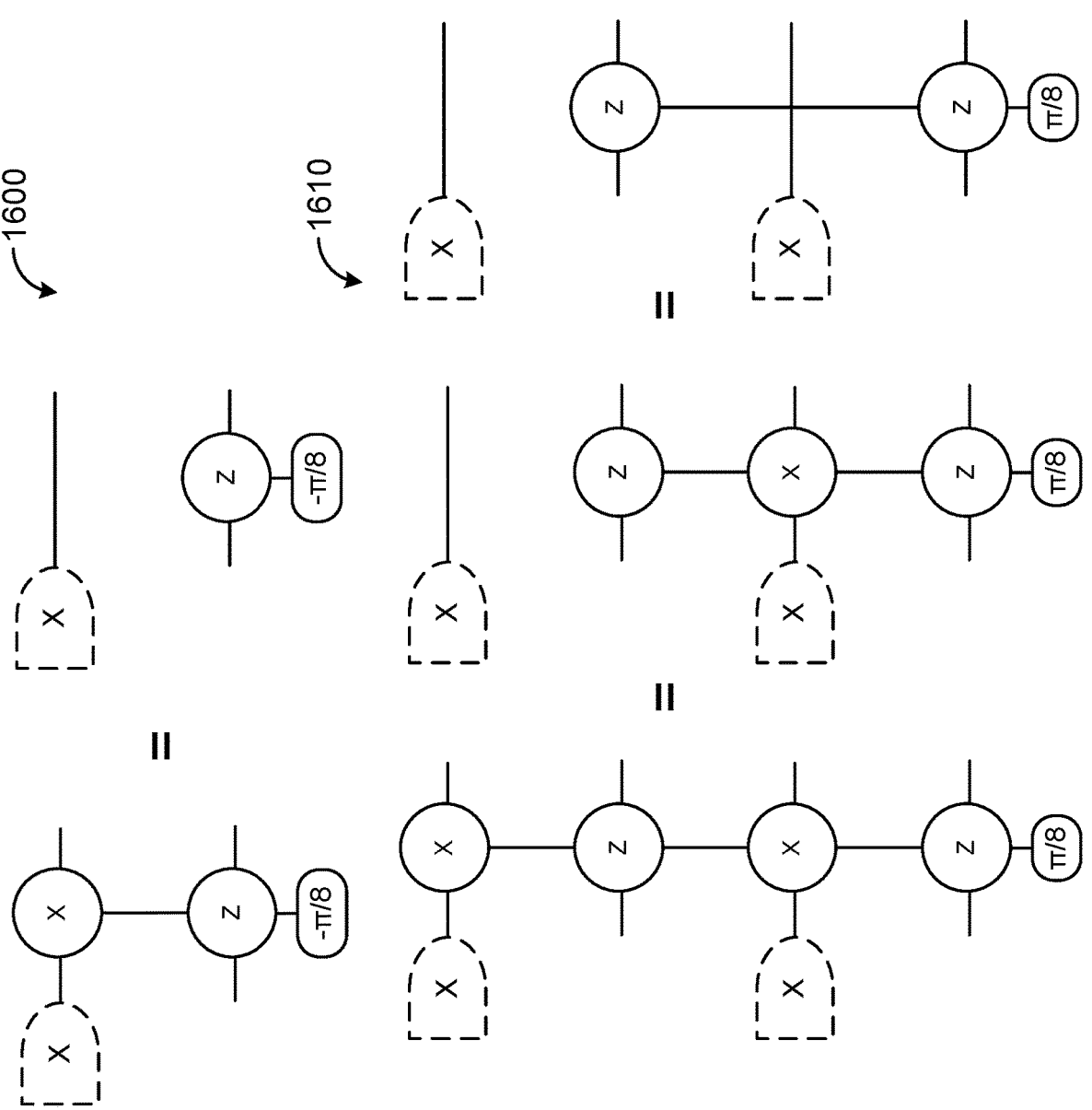
FIG. 16 schematically shows additional quantum circuit identities.

Repeatedly applying Proposition 1.4 and identity from circuit 1400 to circuit 1300 allows for the transformation of all ±π/8 Pauli exponents and removal of all ±π/4 Pauli exponents, resulting in the example quantum circuit 1500 shown in FIG. 15.

Proposition 1.5: Let $|\psi\rangle$ be an n-qubit state and let Pauli operator Q stabilize $|\psi\rangle$, that is let $Q|\psi\rangle = |\psi\rangle$. For any operator P commuting with Q, $\exp(i\phi P)|\psi\rangle = \exp(i\phi QP)|0\rangle$.

As proof, recall that $\exp(i\phi P) = I^{\otimes n} \cos(\phi) + i\sin(\phi)P$. Thus if $Q|\psi\rangle = |\psi\rangle$, it is implied that $$(I^{\otimes n}\cos(\phi) + i\sin(\phi)P)|\psi\rangle = (I^{\otimes n}\cos(\phi) + i\sin(\phi)PQ)|\psi\rangle \tag{13}.$$

Because P and Q commute, the product PQ is a Hermitian operator and $I^{\otimes n}\cos(\phi) + i\sin(\phi)PQ = \exp(i\phi QP)$.

This proposition allows for further simplification of outlined portion 1510 of FIG. 15 by removing the X term from the exponent. The proposition leads to circuit identities 1600 and 1610 shown in FIG. 16. Repeatedly applying Proposition 1.5 to circuit 1500 removes all X's from Pauli exponents, and the equivalence of left-hand side and right-hand side circuits follows from the decomposition of CCZ in terms of seven Pauli exponents as shown in FIG. 12.

Despite the capabilities of quantum computers, they are still limited in throughput over time. The methods disclosed herein enable advanced construction within such a resource constrained quantum computer. Remote and delayed execution methods allow for the implementation of a rich class of algorithms, as they eliminate requirements to break down each operator and then rely on standard methods for implementing the operators over a static layout. In other words, the above provides a direct way of remotely performing diagonal n-qubit gates among other gates.

Diagonal n-qubit gates can take a relatively long time to execute. The methods described herein enact a time savings in executing quantum algorithms by enabling parallelized execution. Diagonal n-qubit gates can be performed in parallel while the quantum computer is performing other operations. The quantum computer may effectively be separated into two domains: one for performing diagonal n-qubit gates and one for performing all other gates. This speeds up execution of quantum algorithms, returning solutions faster.

A primary goal of quantum computing is to solve commercially valuable problems. Presently, this is achieved by using quantum error correction protocols and fault tolerant protocols. Currently there exists one primary fault tolerant protocol (lattice surgery surface code). This protocol is enacted with a certain set of basic operations. The methodology described herein may be implemented as an add-on to those basic operations. This methodology is valuable to both large-scale quantum computers as well as to smaller (e.g., 100 qubit) computers where there is a desire to improve resource utilization.

In one example, a method for operating a quantum computing device comprises receiving a request to execute a first n-qubit gate on a set of n target qubits, the first n-qubit gate representable as an m-qubit diagonal gate conjugated by a Clifford gate, where m≤n; identifying a set of m interface qubits on which to perform the m-qubit diagonal gate; executing a Clifford operation on each interface qubit and its corresponding target qubits; and executing the m-qubit diagonal gate on the set of m interface qubits. In such an example, or any other example, the Clifford operations executed on the interface qubits and corresponding target qubits are additionally or alternatively multi-qubit Pauli measurements. In any of the preceding examples, or any other example, the multi-qubit Pauli measurements are additionally or alternatively executed by using pre-established entanglement. In any of the preceding examples, or any other example, the Clifford operations executed on the interface qubits and corresponding target qubits are additionally or alternatively multi-qubit Pauli gates X-controlled on the interface qubits. In any of the preceding examples, or any other example, the multi-qubit Pauli gates X-controlled on the interface qubits are additionally or alternatively executed using pre-established entanglement.

In another example, a method for operating a quantum computing device comprises receiving a request to execute a first n-qubit gate on a set of n target qubits, the first n-qubit gate representable as an m-qubit diagonal gate conjugated by a Clifford gate, where m≤n; identifying a set of m interface qubits on which to perform the m-qubit diagonal gate; executing a Clifford operation on each interface qubit and its corresponding target qubits; executing the m-qubit diagonal gate on the set of m interface qubits; and performing computations on one or more of the n target qubits prior to completion of the execution of the m-qubit diagonal gate on the set of m interface qubits. In such an example, or any other example, the Clifford operations executed on interface qubits and corresponding target qubits are additionally or alternatively multi-qubit Pauli measurements. In any of the preceding examples, or any other example, the multi-qubit Pauli measurements are additionally or alternatively executed by using pre-established entanglement. In any of the preceding examples, or any other example, the Clifford operations executed on interface qubits and corresponding target qubits are additionally or alternatively multi-qubit Pauli gates X-controlled on the interface qubits. In any of the preceding examples, or any other example, the multi-qubit Pauli gates X-controlled on the interface qubits are additionally or alternatively executed using pre-established entanglement. In any of the preceding examples, or any other example, the method additionally or alternatively comprises receiving a request to execute an n'-qubit gate on a set of n' target qubits, the set of n' target qubits including one or more of the set of n target qubits; and initiating execution of the n'-qubit gate on the set of n' target qubits prior to completion of the execution of the m-qubit diagonal gate on the set of m interface qubits. In any of the preceding examples, or any other example, executing n'-qubit gates on the set of n' target qubits additionally or alternatively includes executing a Clifford operations on each interface qubit and its corresponding target qubits. In any of the preceding examples, or any other example, the Clifford operations executed on interface qubits and corresponding target qubits are additionally or alternatively multi-qubit Pauli measurements. In any of the preceding examples, or any other example, the multi-qubit Pauli measurements are additionally or alternatively executed by using pre-established entanglement. In any of the preceding examples, or any other example, the Clifford operations executed on interface qubits and corresponding target qubits are additionally or alternatively multi-qubit Pauli gates X-controlled on the interface qubits. In any of the preceding examples, or any other example, the multi-qubit Pauli gates X-controlled on the interface qubits are additionally or alternatively executed using pre-established entanglement. In any of the preceding examples, or any other example, the method additionally or alternatively comprises identifying one or more qubits within the set of n target qubits and n' target qubits to which multi-qubit Pauli correction is indicated; responsive to completing the execution of the m-qubit diagonal gate on the set of m interface qubits, measuring spin along X on the set of m interface qubits; and storing measured spin values for X. In any of the preceding examples, or any other example, the method additionally or alternatively comprises performing multi-qubit Pauli corrections on at least the identified target qubits. In any of the preceding examples, or any other example, the multi-qubit Pauli corrections are additionally or alternatively performed by using pre-established entanglement.

In yet another example, a method for a quantum computer comprises receiving a request to execute an n-qubit gate on a set of n target qubits, where n is an integer and n≥1, and where the n-qubit gate is representable as an m-qubit diagonal gate conjugated by an n-qubit Clifford gate, where m is an integer and m≤n; identifying a set of m interface qubits on which to perform the m-qubit diagonal gate; executing a Clifford operation on each interface qubit and its corresponding target qubits; executing the m-qubit diagonal gate on the set of m interface qubits; performing computations on one or more of the n target qubits prior to completion of the execution of the first m-qubit diagonal gate on the set of m interface qubits; receiving a request to execute an n'-qubit gate on a set of n' target qubits, the set of n' target qubits including one or more of the set of n target qubits; initiating execution of the n'-qubit gate on the set of n' target qubits prior to completion of the execution of the first m-qubit diagonal gate on the set of m interface qubits; identifying one or more qubits within the set of n target qubits and n' target qubits to which multi-qubit Pauli correction is indicated; responsive to completing the execution of the m-qubit diagonal gate on the set of m interface qubits, measuring spin along X on the set of m interface qubits; storing measured spin values for X and performing multi-qubit Pauli corrections on at least the identified target qubits.

In still another example, a method for operating a quantum computing device comprises receiving a request to execute a first n-qubit gate on a set of n target qubits, the n-qubit gate including one or both of a diagonal gate and a diagonal gate conjugated by a multi-qubit Clifford gate; identifying a set of n interface qubits on which to perform the first n-qubit gate, the set of n interface qubits located remotely from the set of n target qubits; executing a joint Z-Z measurement on each target qubit and its corresponding interface qubit via a pre-established entanglement; and executing the first n-qubit gate on the set of n interface qubits. In such an example, or any other example, each remotely located interface qubit is additionally or alternatively located non-adjacently to a corresponding target qubit. In any of the preceding examples, or any other example, the pre-established entanglement additionally or alternatively includes a set of n Bell pairs, such that a first qubit of each Bell pair is positioned locally to a first qubit of the n target qubits, and a second qubit of the Bell pair is positioned locally to a first qubit of the n interface qubits. In any of the preceding examples, or any other example, the method additionally or alternatively comprises identifying, via classical tracking, one or more qubits within the set of n target qubits for which Z correction is indicated. In any of the preceding examples, or any other example, the method additionally or alternatively comprises, responsive to completing the execution of the first n-qubit gate on the set of n interface qubits, measuring spin along X on the set of n interface qubits; storing measured spin values for X; and identifying, via classical tracking, one or more qubits within the set of n interface qubits for which Z correction is indicated. In any of the preceding examples, or any other example, the method additionally or alternatively comprises performing Z correction on at least the identified target qubits and the identified interface qubits. In any of the preceding examples, or any other example, the first n-qubit gate is additionally or alternatively a diagonal n-qubit quantum gate. In any of the preceding examples, or any other example, the first n-qubit gate is additionally or alternatively executed as part of a set of 2 or more gates.

In a further example, a method for operating a quantum computing device comprises receiving a request to execute a first n-qubit gate on a set of n target qubits, the n-qubit gate including one or both of a diagonal gate and a diagonal gate conjugated by a multi-qubit Clifford gate; identifying a set of n interface qubits on which to perform the first n-qubit gate; executing a joint Z-Z measurement on each target qubit and its corresponding interface qubit; executing the first n-qubit gate on the set of n interface qubits; and performing computations on one or more of the n target qubits prior to completion of the execution of the first n-qubit gate on the set of n interface qubits. In such an example, or any other example, the method additionally or alternatively comprises receiving a request to execute an m-qubit gate on a set of m target qubits, the set of m target qubits including one or more of the set of n target qubits; and initiating execution of the m-qubit gate on the set of m target qubits prior to completion of the execution of the first n-qubit gate on the set of n interface qubits. In any of the preceding examples, or any other example, the method additionally or alternatively comprises identifying, via classical tracking, one or more qubits within the set of n target qubits for which Z correction is indicated. In any of the preceding examples, or any other example, the method additionally or alternatively comprises, responsive to completing the execution of the first n-qubit gate on the set of n interface qubits, measuring spin along X on the set of n interface qubits; storing measured spin values for X; and identifying, via classical tracking, one or more qubits within the set of n interface qubits to which Z correction is indicated. In any of the preceding examples, or any other example, the method additionally or alternatively comprises performing Z correction on at least the identified target qubits and the identified interface qubits. In any of the preceding examples, or any other example, the first n-qubit gate is additionally or alternatively a diagonal n-qubit quantum gate. In any of the preceding examples, or any other example, the first n-qubit gate is additionally or alternatively executed as part of a set of 2 or more gates. In any of the preceding examples, or any other example, one or more qubits of the set of n interface qubits are additionally or alternatively located remotely from the set of n target qubits.

In still a further example, a method for a quantum computer, comprises receiving a request to execute an n-qubit gate on a set of n target qubits, where n is an integer and n≥1, and where the n-qubit gate being an m-qubit diagonal gate conjugated by an n-qubit Clifford gate, where m is an integer and m≤n; identifying a set of m interface qubits on which to perform the m-qubit diagonal gate; executing a multi-qubit Pauli measurement on each interface qubit and its corresponding target qubits; executing the m-qubit diagonal gate on the set of m interface qubits; performing computations on one or more of the n target qubits prior to completion of the execution of the first m-qubit diagonal gate on the set of m interface qubits; receiving a request to execute an n'-qubit gate on a set of n' target qubits, the set of n' target qubits including one or more of the set of n target qubits; initiating execution of the n'-qubit gate on the set of n' target qubits prior to completion of the execution of the first m-qubit diagonal gate on the set of m interface qubits; identifying one or more qubits within the set of n target and n' target qubits to which multi-qubit Pauli correction is indicated; responsive to completing the execution of the m-qubit diagonal gate on the set of m interface qubits, measuring spin along X on the set of m interface qubits; storing measured spin values for X; and performing multi-qubit Pauli corrections on at least the identified target qubits. In such an example, or any other example, one or more of the set of m interface qubits are additionally or alternatively located remotely from corresponding target qubits. In any of the preceding examples, or any other example, the multi-qubit Pauli measurement is additionally or alternatively executed via pre-established entanglement between an interface qubit and corresponding target qubits. In any of the preceding examples, or any other example, the Clifford gate is additionally or alternatively an identity gate.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method, comprising:

receiving a request to execute a first qubit gate on a set of target qubits, the first qubit gate representable as a diagonal gate conjugated by a Clifford gate, where the diagonal gate is executable on a set of interface qubits, the set of interface qubits having at most the same number of qubits as the set of target qubits;

executing Clifford operations on the set of interface qubits and the set of target qubits; and executing the diagonal gate on the set of interface qubits.

2. The method of claim 1, wherein the Clifford operations executed on the set of interface qubits and the set of target qubits are multi-qubit Pauli measurements, and wherein a number of qubits in the first qubit gate is less than or equal to 8 qubits.

3. The method of claim 2, wherein the multi-qubit Pauli measurements are executed by using pre-established entanglement.

4. The method of claim 1, wherein the Clifford operations executed on the set of interface qubits and the set of target qubits are multi-qubit Pauli gates X-controlled on the set of interface qubits.

5. The method of claim 4, wherein the multi-qubit Pauli gates X-controlled on the set of interface qubits are executed using pre-established entanglement.

6. A method, comprising:

receiving a request to execute a first qubit gate on a first set of target qubits, the first qubit gate representable as a diagonal gate conjugated by a Clifford gate, where the diagonal gate is executable on a set of interface qubits, the set of interface qubits having at most the same number of qubits as the first set of target qubits;

executing Clifford operations on the set of interface qubits and the first set of target qubits;

executing the diagonal gate on the set of interface qubits; and performing computations on one or more qubits of the first set of target qubits prior to completion of the execution of the diagonal gate on the set of interface qubits.

7. The method of claim 6, wherein the Clifford operations executed on the set of interface qubits and the first set of target qubits are multi-qubit Pauli measurements.

8. The method of claim 7, wherein the multi-qubit Pauli measurements are executed by using pre-established entanglement.

9. The method of claim 6, wherein the Clifford operations executed on the set of interface qubits and the first set of target qubits are multi-qubit Pauli gates X-controlled on the set of interface qubits.

10. The method of claim 9, wherein the multi-qubit Pauli gates X-controlled on the set of interface qubits are executed using pre-established entanglement.

11. The method of claim 6, further comprising:

receiving a request to execute a second qubit gate on a second set of target qubits, the second set of target qubits including one or more of the first set of target qubits; and initiating execution of the second qubit gate on the second set of target qubits prior to completion of the execution of the diagonal gate on the set of interface qubits.

12. The method of claim 11, wherein executing the second qubit gate on the second set of target qubits includes executing a Clifford operation on one or more qubits of the set of interface qubits and one or more corresponding target qubits of the second set of target qubits.

13. The method of claim 12, wherein the Clifford operations executed on one or more qubits of the set of interface qubits and the one or more corresponding target qubits of the second set of target qubits are multi-qubit Pauli measurements.

14. The method of claim 13, wherein the multi-qubit Pauli measurements are executed by using pre-established entanglement.

15. The method of claim 11, wherein the Clifford operations executed on one or more qubits of the set of interface qubits and the one or more corresponding target qubits of the second set of target qubits are multi-qubit Pauli gates X-controlled on the one or more qubits of the set of interface qubits.

16. The method of claim 15, wherein the multi-qubit Pauli gates X-controlled on the one or more qubits of the set of interface qubits are executed using pre-established entanglement.

17. The method of claim 11, wherein the method further comprises:

responsive to completing the execution of the diagonal gate on the set of interface qubits, measuring spin along X on the set of interface qubits; and storing measured spin values for X.

18. The method of claim 17, further comprising:

performing multi-qubit Pauli corrections on one or more qubits of the first set of target qubits and the second set of target qubits.

19. The method of claim 18, wherein the multi-qubit Pauli corrections are performed by using pre-established entanglement.

20. A method, comprising:

receiving a request to execute a first qubit gate on a first set of target qubits, and where the first qubit gate is representable as a diagonal gate conjugated by a Clifford gate, where the diagonal gate is executable on a set of interface qubits, the set of interface qubits having at most the same number of qubits as the first set of target qubits;

executing Clifford operations on the set of interface qubits and the first set of target qubits;

executing the diagonal gate on the set of interface qubits;

performing computations on one or more qubits of the first set of target qubits prior to completion of the execution of the diagonal gate on the set of interface qubits;

receiving a request to execute a second qubit gate on a second set of target qubits, the second set of target qubits including one or more qubits of the first set of target qubits;

initiating execution of the second qubit gate on the second set of target qubits prior to completion of the execution of the diagonal gate on the set of interface qubits;

responsive to completing the execution of the diagonal gate on the set of interface qubits, measuring spin along X on the set of interface qubits;

storing measured spin values for X; and performing multi-qubit Pauli corrections on one or more qubits of the first set of target qubits and the second set of target qubits.

* * * * *